United States Patent
Virkar et al.

(10) Patent No.: US 10,020,807 B2
(45) Date of Patent: Jul. 10, 2018

(54) FUSED METAL NANOSTRUCTURED NETWORKS, FUSING SOLUTIONS WITH REDUCING AGENTS AND METHODS FOR FORMING METAL NETWORKS

(71) Applicant: C3Nano Inc., Hayward, CA (US)

(72) Inventors: Ajay Virkar, Mountain View, CA (US); Xiqiang Yang, Newark, CA (US); Ying-Syi Li, Fremont, CA (US); Dennis McKean, Milpitas, CA (US); Melburne C. LeMieux, San Jose, CA (US)

(73) Assignee: C3NANO INC., Hayward, CA (US)

( * ) Notice: Subject to any disclaimer, the term of this patent is extended or adjusted under 35 U.S.C. 154(b) by 720 days.

(21) Appl. No.: 13/777,802

(22) Filed: Feb. 26, 2013

(65) Prior Publication Data

US 2014/0238833 A1    Aug. 28, 2014

(51) Int. Cl.
*H03K 17/96* (2006.01)
*B32B 15/02* (2006.01)
(Continued)

(52) U.S. Cl.
CPC ......... *H03K 17/9622* (2013.01); *B32B 15/02* (2013.01); *B32B 15/08* (2013.01); *B32B 15/18* (2013.01); *B32B 27/281* (2013.01); *B32B 27/286* (2013.01); *B32B 27/288* (2013.01); *B32B 27/304* (2013.01); *B32B 27/306* (2013.01); *B32B 27/308* (2013.01);
(Continued)

(58) Field of Classification Search
CPC ..................................................... B82Y 40/00
See application file for complete search history.

(56) References Cited

U.S. PATENT DOCUMENTS

| | | | |
|---|---|---|---|
| 5,665,639 | A | 9/1997 | Seppala et al. |
| 6,741,019 | B1 | 5/2004 | Filas et al. |

(Continued)

FOREIGN PATENT DOCUMENTS

| | | |
|---|---|---|
| JP | 2009-129882 A | 6/2009 |
| JP | 5289859 B2 | 2/2010 |

(Continued)

OTHER PUBLICATIONS

Chang et al., "Highly foldable transparent conductive films composed of silver nanowire junctions prepared by chemical metal reduction," Nanotechnology 25 (2014) 285601 (7 pages).

(Continued)

*Primary Examiner* — Chinessa T. Golden
(74) *Attorney, Agent, or Firm* — Christensen, Fonder, Dardi & Herbert PLLC; Peter S. Dardi

(57) ABSTRACT

Reduction/oxidation reagents have been found to be effective to chemically cure a sparse metal nanowire film into a fused metal nanostructured network through evidently a ripening type process. The resulting fused network can provide desirable low sheet resistances while maintaining good optical transparency. The transparent conductive films can be effectively applied as a single conductive ink or through sequential forming of a metal nanowire film with the subsequent addition of a fusing agent. The fused metal nanowire films can be effectively patterned, and the patterned films can be useful in devices, such as touch sensors.

32 Claims, 10 Drawing Sheets

(51) Int. Cl.

| | |
|---|---|
| *G06F 3/044* | (2006.01) |
| *C09D 11/52* | (2014.01) |
| *H05K 1/09* | (2006.01) |
| *B32B 15/08* | (2006.01) |
| *B32B 15/18* | (2006.01) |
| *B32B 27/28* | (2006.01) |
| *B32B 27/30* | (2006.01) |
| *B32B 27/32* | (2006.01) |
| *B32B 27/34* | (2006.01) |
| *B32B 27/36* | (2006.01) |
| *B32B 27/40* | (2006.01) |
| *H05K 3/02* | (2006.01) |
| *H05K 3/06* | (2006.01) |
| *H05K 3/12* | (2006.01) |

(52) U.S. Cl.
CPC ............. *B32B 27/32* (2013.01); *B32B 27/34* (2013.01); *B32B 27/36* (2013.01); *B32B 27/40* (2013.01); *C09D 11/52* (2013.01); *G06F 3/044* (2013.01); *H05K 1/097* (2013.01); *B32B 2270/00* (2013.01); *B32B 2307/202* (2013.01); *B32B 2307/412* (2013.01); *B32B 2457/00* (2013.01); *G06F 2203/04103* (2013.01); *G06F 2203/04112* (2013.01); *H03K 2217/96031* (2013.01); *H05K 3/027* (2013.01); *H05K 3/06* (2013.01); *H05K 3/1283* (2013.01); *H05K 2201/0108* (2013.01); *H05K 2201/026* (2013.01); *H05K 2203/107* (2013.01); *H05K 2203/1131* (2013.01); *H05K 2203/1157* (2013.01); *H05K 2203/125* (2013.01); *Y10T 428/12424* (2015.01); *Y10T 428/12444* (2015.01); *Y10T 442/655* (2015.04)

(56) References Cited

U.S. PATENT DOCUMENTS

| | | |
|---|---|---|
| 7,849,424 B2 | 12/2010 | Wolk et al. |
| 7,902,639 B2 | 3/2011 | Garrou et al. |
| 7,922,787 B2 | 4/2011 | Wang et al. |
| 8,018,563 B2 | 9/2011 | Jones et al. |
| 8,018,568 B2 | 9/2011 | Allemand et al. |
| 8,031,180 B2 | 10/2011 | Miyamoto et al. |
| 8,049,333 B2 | 11/2011 | Alden et al. |
| 8,052,773 B2 | 11/2011 | Takada |
| 8,094,247 B2 | 1/2012 | Allemand et al. |
| 8,174,667 B2 | 5/2012 | Allemand et al. |
| 8,198,796 B2 | 6/2012 | Takada |
| 9,150,746 B1 | 10/2015 | Li et al. |
| 9,183,968 B1 | 11/2015 | Li et al. |
| 2005/0074589 A1 | 4/2005 | Pan et al. |
| 2005/0196707 A1 | 9/2005 | Cok |
| 2005/0214480 A1 | 9/2005 | Garbar et al. |
| 2005/0215689 A1 | 9/2005 | Garbar et al. |
| 2006/0052947 A1 | 3/2006 | Hu |
| 2006/0083694 A1* | 4/2006 | Kodas .................. B01J 13/0043 424/46 |
| 2006/0163744 A1 | 7/2006 | Vanheusden et al. |
| 2006/0205240 A1 | 9/2006 | Pan et al. |
| 2008/0003130 A1 | 1/2008 | Xia et al. |
| 2008/0034921 A1* | 2/2008 | Vanheusden .......... B22F 1/0022 75/362 |
| 2008/0050513 A1 | 2/2008 | Wang et al. |
| 2008/0143906 A1 | 6/2008 | Allemand et al. |
| 2008/0210052 A1 | 9/2008 | Allemand |
| 2008/0213663 A1 | 9/2008 | Hu et al. |
| 2008/0259262 A1 | 10/2008 | Jones et al. |
| 2008/0283799 A1 | 11/2008 | Alden et al. |
| 2008/0286447 A1 | 11/2008 | Alden et al. |
| 2008/0286488 A1 | 11/2008 | Li et al. |
| 2008/0292979 A1 | 11/2008 | Ding et al. |
| 2008/0317982 A1* | 12/2008 | Hecht ..................... H01B 1/24 428/34.1 |
| 2009/0011147 A1 | 1/2009 | Dictus |
| 2009/0052029 A1 | 2/2009 | Dai et al. |
| 2009/0088326 A1 | 4/2009 | Baecker |
| 2009/0098405 A1 | 4/2009 | Matsunami |
| 2009/0129004 A1 | 5/2009 | Gruner |
| 2009/0130433 A1* | 5/2009 | Takada .................. B22F 1/0025 428/328 |
| 2009/0166055 A1 | 7/2009 | Guiheen et al. |
| 2009/0196788 A1* | 8/2009 | Wang ....................... B22F 9/24 420/501 |
| 2009/0223703 A1 | 9/2009 | Winoto |
| 2009/0242231 A1 | 10/2009 | Miyagisima et al. |
| 2009/0283304 A1 | 11/2009 | Winoto |
| 2009/0301769 A1 | 12/2009 | Seppa et al. |
| 2009/0305437 A1 | 12/2009 | Allemand et al. |
| 2009/0311530 A1 | 12/2009 | Hirai et al. |
| 2009/0317435 A1 | 12/2009 | Vandesteeg et al. |
| 2009/0321113 A1 | 12/2009 | Allemand et al. |
| 2009/0321364 A1 | 12/2009 | Spaid et al. |
| 2010/0078197 A1 | 4/2010 | Miyagishima et al. |
| 2010/0078602 A1 | 4/2010 | Hosoya et al. |
| 2010/0197068 A1 | 8/2010 | Poon et al. |
| 2010/0243295 A1 | 9/2010 | Allemand et al. |
| 2010/0307792 A1 | 12/2010 | Allemand et al. |
| 2011/0024159 A1 | 2/2011 | Allemand et al. |
| 2011/0042126 A1 | 2/2011 | Spaid et al. |
| 2011/0045272 A1 | 2/2011 | Allemand |
| 2011/0048170 A1 | 3/2011 | Bhatia et al. |
| 2011/0062389 A1 | 3/2011 | Wang et al. |
| 2011/0088770 A1 | 4/2011 | Allemand et al. |
| 2011/0094651 A1 | 4/2011 | Kuriki |
| 2011/0095275 A1 | 4/2011 | Li et al. |
| 2011/0151211 A1* | 6/2011 | Chang .................... B82Y 40/00 428/209 |
| 2011/0162870 A1 | 7/2011 | Markovich et al. |
| 2011/0163403 A1 | 7/2011 | Bhatia et al. |
| 2011/0174190 A1 | 7/2011 | Sepa et al. |
| 2011/0192633 A1 | 8/2011 | Allemand |
| 2011/0253668 A1 | 10/2011 | Winoto et al. |
| 2011/0285019 A1 | 11/2011 | Alden et al. |
| 2011/0297642 A1 | 12/2011 | Allemand et al. |
| 2012/0033367 A1 | 2/2012 | Jones et al. |
| 2012/0034129 A1 | 2/2012 | Suh et al. |
| 2012/0073947 A1 | 3/2012 | Sakata et al. |
| 2012/0097059 A1 | 4/2012 | Allemand et al. |
| 2012/0103660 A1 | 5/2012 | Gupta et al. |
| 2012/0104374 A1 | 5/2012 | Allemand |
| 2012/0107598 A1 | 5/2012 | Zou et al. |
| 2012/0127097 A1 | 5/2012 | Gaynor et al. |
| 2012/0127113 A1 | 5/2012 | Yau et al. |
| 2012/0132930 A1 | 5/2012 | Young et al. |
| 2012/0138913 A1 | 6/2012 | Alsayed et al. |
| 2012/0168684 A1 | 7/2012 | Magdassi et al. |
| 2012/0223358 A1 | 9/2012 | Pschenitzka |
| 2013/0000952 A1 | 1/2013 | Srinivas et al. |
| 2013/0001478 A1 | 1/2013 | Allemand et al. |
| 2013/0146335 A1 | 6/2013 | Gambino et al. |
| 2013/0056244 A1 | 7/2013 | Srinivas et al. |
| 2013/0266795 A1 | 10/2013 | Schultz et al. |
| 2013/0341074 A1 | 12/2013 | Virkar et al. |
| 2013/0342221 A1 | 12/2013 | Virkar et al. |
| 2014/0054515 A1 | 2/2014 | Lowenthal et al. |
| 2014/0099486 A1 | 4/2014 | Ollmann et al. |
| 2014/0255707 A1 | 9/2014 | Philip et al. |
| 2014/0374146 A1 | 12/2014 | Saito et al. |
| 2015/0144380 A1 | 6/2015 | Yang et al. |
| 2015/0206623 A1 | 7/2015 | Poon |
| 2015/0208498 A1 | 7/2015 | Poon |
| 2015/0321257 A1 | 11/2015 | Suh et al. |

(56) References Cited

U.S. PATENT DOCUMENTS

| | | |
|---|---|---|
| 2016/0096967 A1 | 4/2016 | Virkar et al. |
| 2016/0108256 A1 | 4/2016 | Yang et al. |
| 2016/0122562 A1 | 5/2016 | Yang et al. |

FOREIGN PATENT DOCUMENTS

| | | |
|---|---|---|
| JP | 2012009383 A | 1/2012 |
| JP | 2012-022844 A | 2/2012 |
| JP | 2012-216535 A | 11/2012 |
| KR | 10-2007-0029151 | 3/2007 |
| KR | 10-2010-0098448 A | 9/2010 |
| KR | 20130027634 A | 3/2013 |
| WO | 2008/046058 A2 | 4/2008 |
| WO | 2009-035059 A1 | 3/2009 |
| WO | 2009/086161 | 7/2009 |
| WO | 2009/156990 | 12/2009 |
| WO | 2010/036113 A1 | 4/2010 |
| WO | 2011/08227 A1 | 1/2011 |
| WO | 2011-106730 A1 | 9/2011 |
| WO | 2012-168941 A1 | 12/2012 |
| WO | 2013/006349 A1 | 1/2013 |
| WO | 2013040245 A2 | 3/2013 |
| WO | 2013-095971 A1 | 6/2013 |

OTHER PUBLICATIONS

International Search Report and Written Opinion for international application No. PCT/US14/17652 dated Feb. 18, 2015 (11 pages).

Bi et al., "In situ Oxidation synthesis of AG/AGCI core-shell nanowires and their photocatalytic properties," Chem. Commun. (2009), pp. 6551-6553.

De et al., "Silver Nanowire Networks as Flexible, Transparent Conducting Films: Extremely High DC to Optical Conductivity Ratio," ACS Nano, 3(7):1767-1774 (Jun. 2009).

Grouchko et al., "Conductive Inks with 'built-in' mechanism that enables sintering at room temperature," ACS Nano, 5(4):3354-3359 (2011).

Hu et al., "Scalable coating properties of flexible, silver nanowire electrodes," ACS Nano, 4(5):2955-2963 (2010).

Lam et al., "Self-diffusion in silver at low temperatures," Phys. Stat. Sol. (b), 57 (1973), p. 225-236.

Liu et al., "Silver Nanowire-Based Transparent, Flexible and Conductive Thin Film," Nanoscale Research Letters, vol. 6(75), Jan. 2011, 8 pages.

Luo et al., "Size effect on thermodynamic properties of silver nanoparticles," J. Phys. Chem. C, 112 (2008), pp. 2359-2369.

Magdassi et al., "Triggering the Sintering of Silver Nanoparticles at Room Temperature," ACS Nano, 4(4):1943-1948 (2010).

Nanda, et al., "Higher surface free energy of free nanoparticles," Phys. Rev. Letters, 91(10):106102-1 (2003).

Pothoven, "Laser Patterning of Silver Nanowires," Information Display Magazine, Sep. 2012, 28(9), (10 pages).

Raaen, "Diffusion in silver fluoride," Physical Review B, 21(10):4895-4897 (1980).

Redmond et al., "Electrochemical Ostwald ripening of colloidal Ag particles on conductive substrates," Nano Letters, 5(1):131-135 (2005).

Safaei et al., "Modeling the Melting Temperature of Nanoparticles by an Analytical Approach," J. Phys. Chem. C, 112 (2008), pp. 99-105.

Sun et al., "AgCI nanoparticle nanowires fabricated by template method," Materials Letters, 61 (2007), pp. 1645-1648.

Van Heyningen, "Electron Drift Mobility in Silver Chloride," Physical Review, (Dec. 1, 1962), pp. 2112-2118.

Yan et al., "Recent Research Progress on Preparation of Silver Nanowires by Soft Solution Method," Rev. Adv. Mater. Sci. 24, (2010), pp. 10-15.

Garnett et al., "Self-limited Plasmonic Welding of Silver Nanowire Junctions," Nature Materials, vol. 11, p. 241-249, Mar. 2012.

Spechler et al., "Direct Write Pulsed Laser Processed Silver Nanowire Networks for Transparent Conducting Electrodes," Springer-Verlag, vol. 108, pp. 25-28, May 10, 2012.

Eurepean Search Report and Written Opinion for European application No. PCT/US2014/017652 dated Sep. 21, 2016.

Tokuno et al., "Fabrication of Silver Nanowire Transparent Electrodes at Room Tempature," Nano Research, (2011), 4(12): 1215-1222.

Zhu et al., "Transferable Sefl-welding Silver Nanowire Network as High Performance Transparent Flexible Electrode," Nanotechnology 24, (Jul. 26, 2013), 24(335202): 1-7.

Fuse, Definition of Fuse in English. Oxford Dictionaries https://en.oxforddictionaries.com/definition/fuse. Retrieved Mar. 13, 2017.

Taiwan office action from corresponding Taiwan Application No. 103106126, with translation, dated Jun. 28, 2017 (6 pages).

Korean Office Action from corresponding Korean Patent Application No. 10-2015-7026866 dated Jan. 19, 2018.

\* cited by examiner

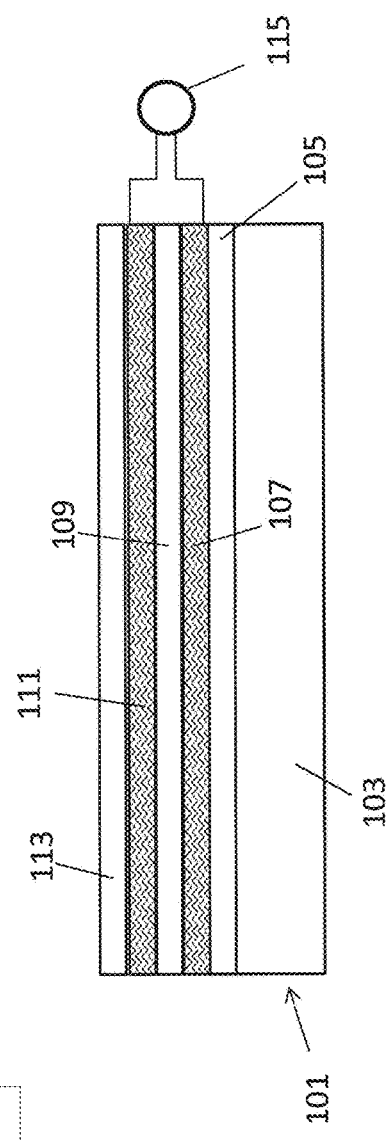
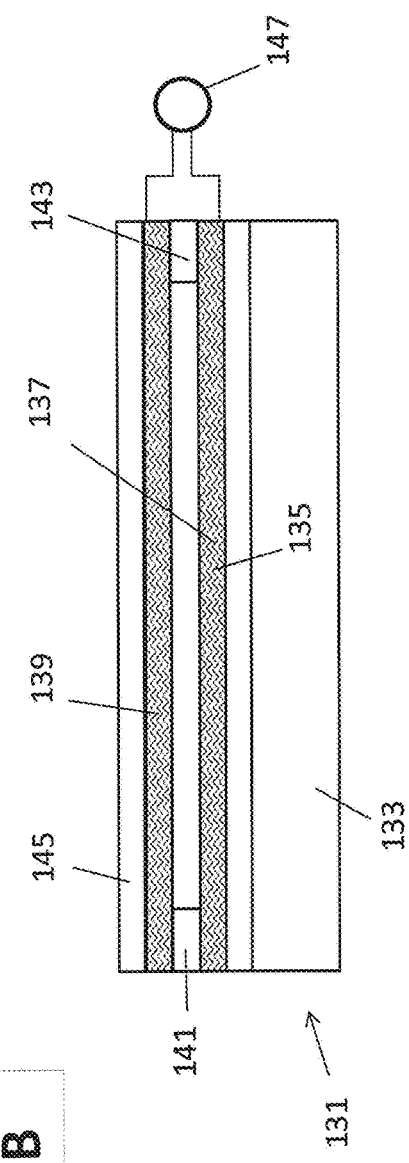
Fig. 2A
Fig. 2B

FUSED METAL NANOSTRUCTURED NETWORKS, FUSING SOLUTIONS WITH REDUCING AGENTS AND METHODS FOR FORMING METAL NETWORKS

FIELD OF THE INVENTION

The invention relates to fused nanostructured metal networks. In addition, the invention relates to fusing processes using oxidation and/or reducing agents to fuse metal nanowires into a nanostructured network. The fused nanostructures metal networks can be effectively used for the formation of transparent conductive films.

BACKGROUND OF THE INVENTION

Functional films can provide important functions in a range of contexts. For example, electrically conductive films can be important for the dissipation of static electricity when static can be undesirable or dangerous. Optical films can be used to provide various functions, such as polarization, anti-reflection, phase shifting, brightness enhancement or other functions. High quality displays can comprise one or more optical coatings.

Transparent conductors can be used for several optoelectronic applications including, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however several shortcomings with ITO. For example, ITO is a brittle ceramic which needs to be deposited using sputtering, a fabrication process that involves high temperatures and vacuum and therefore is relatively slow and not cost effective. Additionally, ITO is known to crack easily on flexible substrates.

SUMMARY OF THE INVENTION

In a first aspect, the invention pertains to a method for forming a fused metal nanostructured network, the method comprising contacting metal nanowires with a fusing solution. In some embodiments, the fusing solution comprises a reducing agent source and a metal ion source. The contacting step is effective to reduce metal ions to its corresponding metal element to fuse the metal nanowires together to form the fused metal nanostructured network.

In other aspects, the invention pertains to a method for forming a fused a fused metal nanostructured network, the method comprising irradiating a metal nanowire film on a substrate surface to form the fused metal nanostructured network.

In a further aspect, the invention pertains to a fusing solution for fusing metal nanowires into an electrically conductive fused metal nanostructured network in which the fusing solution comprises metal nanowires, a metal ion source, and a reducing agent and/or oxidizing agent.

In another aspect, the invention pertains to a fused metal nanostructured network comprising fused metal nanowire segments forming an electrically conductive network substantially free of halides. In some embodiments, the fused metal nanowire segments comprises a first metallic composition, which are fused with a second metallic composition that is either the same or distinct from the first metallic composition to form the fused metal nanostructured network.

Furthermore, the invention pertains to a set of solutions for sequential application comprising a nanowire ink comprising a dispersion of metal nanowires, and a fusing solution. The fusing solution can comprise a metal ion source, and a reducing agent and/or an oxidizing agent, wherein the fusing solution is effective to fuse a film of the metal nanowires upon drying.

In additional embodiments, the invention pertains to a patterned transparent conductive material comprising a substrate, a fused metal nanostructured network covering a portion of a surface of the substrate, and regions of the surface of the substrate substantially free of metal nanowires and fused metal networks. The fused metal nanostructured networks can form an electrically conductive pattern. In some embodiments, the transparent conductive material has a total transmission of visible light of at least about 91%. With respect to the patterned transparent conductive material, a touch sensor can comprise a first electrode structure and a second electrode structure spaced apart in a natural configuration from the first electrode structure, the first electrode structure comprising a first transparent conductive electrode on a first substrate wherein the first transparent conductive electrode comprises the patterned transparent conductive material.

BRIEF DESCRIPTION OF THE DRAWINGS

FIG. 2A is a schematic diagram showing a capacitance based touch sensor.

FIG. 2B is a schematic diagram showing a resistance based touch sensor.

DETAILED DESCRIPTION

Figure 1B:
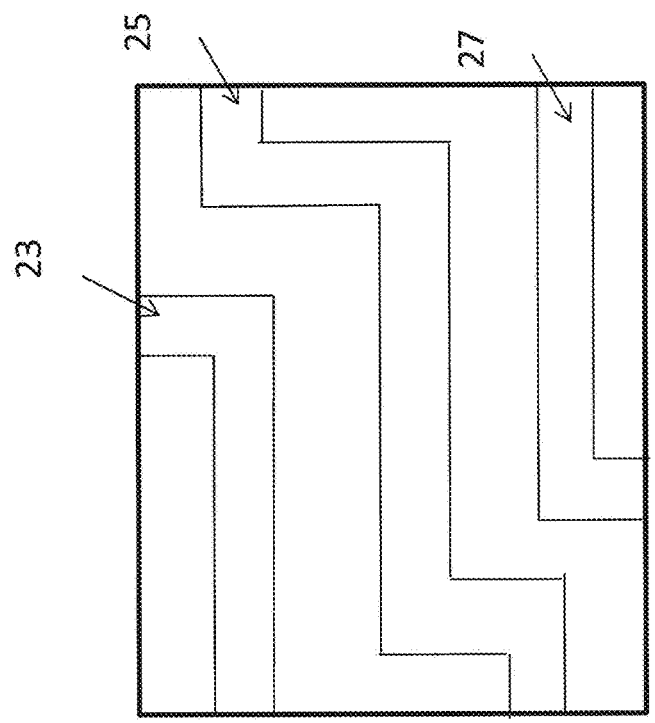
FIG. 1B is a schematic diagram showing sintered network along the substrate surface forming a conductive pattern with a plurality of electrically conductive pathways.

Fused metal nanostructured networks are described with low electrical resistance and high optical transparency, which can be formed using a reduction-oxidation balanced system that is found to drive fused network formation. Moreover, fusing can be driven by ripening processes where material can undergo a net transfer of material between locations to lower the free energy. In some embodiments, the fused joints of the nanostructure may comprise a different elemental metal than the metal element(s) of the metal nanowire components incorporated into the fused structure. In particular, fusing agent solutions can be formed with a blend of an acid and reducing agents selected to reduce metal ions in solution to form the fused joints of the nanostructure. Specific metal ions can be introduced for reduction to elemental metal to form the fused metal nanostructured network. In additional or alternative embodiments, oxidizing agents, e.g., appropriate acidic solutions, can be provided to liberate metal ions from metal nanowire components as effectively the only metal ion source so that the metal nanowires can themselves supply metal ions that are reduced to fuse joints within the resulting nanostructure. The discovery that chemical reducing agents can form fused junctions of metal networks has provided the ability to form new structures as well as to provide alternative approaches for metal network formation in addition to previously discovered halide ion fusing mechanisms. Based on the use of a reducing agent as a fusing agent, nanostructured metal networks can be formed in which the metal at the joints can be a different metal element composition than the metal elements of the component metal nanowires used to form the structure, and these hybrid structures may be desirable in some applications.

Methods are described to effectively process metal nanowire networks with selected structures and appropriate reducing agents as well as acids, which can be an oxidizing agent. The fusing solution can be combined with a metal nanowire dispersion to enable processing of the fused metal nanostructured networks from a single ink. In additional or alternative embodiments, the fusing solution comprising the reducing agent and/or optionally metal cations can be added to a deposited metal nanowire film. Through the selected deposition of a fusing solution, patterning can be effectively performed in which highly conductive regions have fused metal networks and regions of low electrical conductivity are located where no fusing has been performed. Due to the good electrical conductivity and optical transparency, the fused metal nanostructured networks are well suited for the formation of transparent conductive electrodes, such as for appropriate displays, sensors, photovoltaic cells or the like.

To form stable solutions, it is generally desirable to include an acid along with the reducing agent so that metal ions in the fusing solution do not nucleate for particle formation. While there may be ways to process the structures if multiple solutions are used without an oxidizing agent, the processing is generally based on a rough balance of the reduction-oxidation system. When combined with metal nanowires in a film, the poised reduction-oxidation (redox) system induces a net migration of metal to junctions between adjacent nanowires to fuse the junctions. The discovery of this redox driven mechanism for fusing metal nanowires into a nanostructured network provides for added flexibility and processing options for the formation of fused metal nanostructured networks. The observation of a driving force to form the fused networks is consistent with a similar driving force observed with metal atom mobility induced by a metal halide coating over the metal wires. Additionally, it should be noted that the metal ions can be provided in the fusing solution or can be formed by etching the wires. The mobile ions can diffuse and can be reduced at junctions between the nanowires resulting in a decrease in free energy. The net changes I the materials resulting in the fused nanostructure is analogous to an Ostwald ripening process in which for the current ripening process reduction-oxidation reactions evidently drive the mobility of the material to provide for a relatively rapid ripening-type process.

Metal nanowires can be formed from a range of metals. For example, the production of a range of metal nanowires is described, for example, in published U.S. patent application 2010/0078197 to Miyagishima et al., entitled "Metal Nanowires, Method for Producing the Same, and Transparent Conductor," incorporated herein by reference. There has been particular interest in silver nanowires due to the high electrical conductivity of silver. With respect to the specific production of silver nanowires, see for example, published U.S. patent application 2009/0242231 to Miyagisima et al., entitled "Silver Nanowire, Production Methods Thereof, and Aqueous Dispersion," and U.S. 2009/0311530 to Hirai et al., entitled "Silver Nanowire, Production Method Thereof, and Aqueous Dispersion," and U.S. Pat. No. 7,922,787 to Wang et al., "Methods for the Production of Silver Nanowires," all three of which are incorporated herein by reference.

While metal nanowires are inherently electrically conducting, the vast majority of resistance in the silver nanowires based films is believed to due to the junctions between nanowires. Depending on processing conditions and nanowire properties, the sheet resistance of a relatively transparent nanowire film, as deposited, can be very large, such as in the giga-ohm range or even higher. Various approaches have been proposed to reduce the electrical resistance of the nanowire films without destroying the optical transparency. As described herein, low temperature fusing to form a metal nanostructured network has been found to be very effective at lowering the electrical resistance while maintaining the optical transparency.

A significant advance with respect to achieving electrically conductive films based on metal nanowires has been the discovery of a process to form a fused metal network where adjacent sections of the metal nanowires fuse. In particular, it was discovered in previous work that halide ions can drive the low temperature fusing of metal nanowires to form fused metal nanostructures. Fusing agents comprising halide anions were introduced in various ways to successfully achieve the fusing with a corresponding dramatic drop in the electric resistance. Specifically, the fusing of metal nanowires with halide anions has been accomplished with vapor acid halides as well as with solutions of halide salts or acid halides.

Metal halides along the surface of metal nanowires are believed to increase the mobility/diffusivity of the metal ions that result in fusing of points of contact or near contact between nanowires to form the fuse network. Evidence suggests that a metal halide shell forms on the resulting fused nanowire network when the halide fusing agents are used. While not wanting to be limited by theory, it is believed that the metal halide coating on the metal nanowires results in mobilization of metal atoms/ions from the nanowires such that the mobilized ions condense to form joints between nearby nanowires forming the nanostructured network and presumably lowering the free energy when forming the fused network with a net movement of metal atoms within the nanostructure.

With respect to processing, fusing of metal nanowires with halide anions has been successfully accomplished using exposure for short periods of time to acid halide vapors, by the spraying of halide fusing solutions onto a metal nanowire film and with the formation of a ink comprising metal nanowires and a halide fusing agent that results in a fused metal nanostructured network after depositing and drying. The fused metal nanostructured network has an electrical conductivity at least several orders of magnitude greater than the unfused nanowire films while maintaining good optical transparency and low haze. The use of halide anion fusing agents is described in detail in copending U.S. patent application Ser. No. 13/530,822 filed Jun. 22, 2012 to Virkar et al. ("the '822 application"), entitled "Metal Nanowire Networks and Transparent Conductive Material," and U.S. patent application Ser. No. 13/664,159 filed Oct. 30, 2012 to Virkar et al. ("the '159 application"), entitled "Metal Nanostructured Networks and Transparent Conductive Material," both of which are incorporated herein by reference. The '159 application also discusses what can now be recognized as a combined approach in which silver fluoride dissolved in ethanol is applied as a fusing solution. In the combined solution, the fluoride ions can be effective themselves in forming a metal fluoride, e.g., silver fluoride, shell over metal nanowires to facilitate metal migration to fuse adjacent nanowires, and the ethanol can reduce silver ions in the solution to also fuse adjacent nanowires, as described in detail herein. It is now appreciated that these fusing solutions can induce both mechanisms for forming the fused metal nanostructured network.

As described herein, it has been discovered that fused nanostructured metal networks can be formed through a reduction-oxidation mechanism that is a seemingly very different mechanism from the halide driven mechanism previously discovered. Specifically, reducing agents and/or oxidizing have been discovered to provide a driving force to generate the fusing of metal nanowires using metal ions from solution to form fused metal nanostructured networks. With respect to the use of reducing agents, generally metal ions are in the solution as a source of cations for reduction to the elemental metal. The reduced metal is found to effectively fuse adjacent metal nanowires to form the desired fused metal nanostructured network. The metal ions for reduction can be introduced through the addition of a selected metal salt to the fusing solution or through the in situ formation of the metal ions from metal nanowire components. Specifically, addition of an oxidizing acid to the fusing solution can etch the metal nanowires to form metal cations of the metal nanowire metal. An oxidizing agent can also balance a reducing agent to stabilize a fusing solution and/or drive the fusing reaction under more controlled conditions. Moreover, the fusing solution may provide or produce metal ions which can be reduced at intersections or close contact points between wires and fuse the structures together.

Fusing solutions generally comprise a reducing agent that induces the fusing and may further comprise a metal ion source and/or metal nanowires. Acids can be useful in the fusing solutions to help dissolve or partially remove polymer coatings on the nanowires from the nanowire synthesis process and an oxidizing acid can be useful to buffer the potential to control the deposition process and stabilize the fusing solution. In particular, it is generally desirable to include the metal ion source in the fusing solution so that a separate solution with the metal ion source is not separately deposited. However, with respect to the metal nanowires, it may or may not be desirable to first deposit the metal nanowires into a film and then perform the fusing process through the addition of the fusing solution. If a single solution is used with the metal nanowires and the fusing agents, it may be desirable to form the solution shortly prior to use if the metal nanowires are etched by the other components of the fusing solution. As noted above, the reducing agent may or may not be a solvent, which would be correspondingly present at high concentrations. Metal sources can be a metal salt dissolved into the solution or an oxidizing agent that generates metal ions from the metal nanowires.

Regardless of the source of the metal ions in solution, the reducing agent can be effective to deposit metal at junction locations of adjacent metal nanowires to fuse adjacent metal nanowires to form the fused nanostructured network. Moreover, once metal ions are present, they can diffuse to areas between nanowires and can be reduced at junctions between nanowires, which result in an electrochemical Ostwald-type ripening since deposition at the junction points can be thermodynamically more favorable than deposition along the wire segments. A metal salt added to the fusing solution can comprise the same metal element or a different metal element relative to the initial metal nanowires added to the network. In this way, the joints of the fused nanostructured network can comprise the same or different metals of the initial metal nanowire components incorporated into the network. As described further below, in some embodiments, it can be desirable for the joints to be formed from a different metal than the metal nanowire components that are fused into the nanostructure.

A suitable reducing agent should be able to drive the reduction of a metal ion to its elemental form: $M^{a+} \rightarrow M^0$, where M is the selected metal, "a" is the oxidation state of the metal cation and $M^0$ indicates the elemental form of the metal. It has been found that a mild reducing agent, such as certain organic compounds, can be sufficient to drive the fusing process. For example, an alcohol solvent, such as ethanol, can drive the fusing for at least some metals. The results herein suggest that the reduced metal tends to preferentially deposit at junction points of adjacent metal nanowires to facilitate formation of the fused metal nanostructured network. Selected reducing agents can be in high concentrations, for example as the solvent or a component of a solvent mixture or as a solute at a selected concentration. Various alcohols can be used as suitable reducing agents for silver, palladium, and copper. In particular, ethanol and propylene glycol are found to be effective for the reduction of metals to form the fused metal networks. Alcohols can be oxidized to aldehydes/ketones or to carboxylic acids while correspondingly reducing the metal cations. Alternatively other reducing agents, such as organic or inorganic reducing agents can be added to the fusing solution at an appropriate concentration.

Combined systems can involve a fusing solution comprising metal halides and a reducing agent. These systems are observed to form metal halide shells over the fused metal nanostructure network. Presumably, these systems can have fusing of junctions through one or both mechanisms.

In circumstances in which the metal ions for fusing of the metal network are supplied from metal nanowire components, the fusing solution generally comprises both an oxidizing agent and a reducing agent. With respect to in situ generation of metal cations, an oxidizing acid, such as nitric acid can be used to etch, i.e., oxidize, the metal nanowires to generate metal cations. Acids may also be useful to remove any residual polymers that may be associated with metal nanowires form their synthesis, as obtained in commercial samples. The presence of oxidizing agents and reducing agents within the solution in some sense buffers the redox (reduction-oxidation) potential of the system, and the redox agents can be balanced to achieve desired results. An excess of oxidizing agents can etch the metal more than desired, and too strong of an oxidizing agent may quench the reduction of the metal so that no fusing may occur. If the oxidation agent and the reducing agent are reasonably balanced, metal is etched to supply metal ions into the solution, and the reducing agent reduces the metal ions to form elemental metal that evidently preferentially accumulates at junction points of adjacent metal nanowires. During the ripening process, metal migrates gradually from the metal wires to form fused junctions. Thus, it is observed that there is a net metal migration from the metal nanowire segments of the lattice to the joints of the network. While not wanting to be limited by theory, this observation strongly suggests a decrease in free energy through the migration of metal to the joints from the connected segments. The rate of fusing may be influenced by the balance of the oxidizing and reducing agents. The process can be appropriately quenched following a desired degree of fusing of the joints of the fused metal network. Quenching can be accomplished, for example, through drying, rinsing, dilution or a series of processing steps.

In summary, the effective fusing of metal nanowires based on metal reduction-oxidation mechanisms described herein involves the introduction of a significant concentration of metal ions in solution along with an oxidation agent and/or reducing agent. Each activation agent generally induces a reaction, which is generally reversible, that results in metal migration with interconversion from the ionized and elemental, i.e., unionized, forms. The ripening process results in a net migration to fuse the metal nanostructured network. The metal ions can be added to the fusing solution, or the metal ions can be generated in situ from metal nanowires themselves. The reducing agent can be the solvent and/or a reducing agent added to the fusing solution. Within this conceptual framework a range of processing approaches can be adapted successfully. In addition, the fusing mechanisms can be used to conveniently pattern the fused metal nanostructured network along a substrate surface. The fusing achieved with reduction can be used to effectively form conductive films with good transparency and low haze.

As noted above, metal ions for forming fused junctions can be generated from the nanowire starting components themselves or the metal ions can be added to the solution. The metal ions in solution can comprise the same element as the metal nanowires to be fused into the network so that the fused junctions of the network have the same metal as the nanowires. However, through the addition of the metal ions to the solution, the deposited metal can be a different metal element than present in the initial metal nanowire starting material. It may be desirable to use a different metal at the joints forming the fused network to potentially reduce effects of electromigration of metal during uses of the fused networks as electrically conductive films. The fusing solution can similarly comprise a mixture of metal ions, which may or may not be reduced from solution at the same rate. In general, the fused metal nanostructured network can comprise the same or different metals forming fused joints relative to the core metals of the fused network. Metal deposited from the solution by reduction may coat the nanostructured lattice in addition to forming joints to fuse the network.

In contrast with respect to the earlier work involving halide ions to drive the fusing of metal nanowires, the fusing driven by a reducing agent generally is not expected to form a core shell structure, so that the fused metal nanostructured networks described herein differ in this respect from the earlier described fused networks. It has been proposed that the core-metal halide shell structure can influence the optical properties of the metal network due to a lower reflectivity of metal halides, so the fused metal networks described herein may offer slightly different optical properties. It is believed that a lower metal, e.g., metal nanowire, loading can be successful to achieve desired electrical conductivities with fusing in comparison with methods based on unfused metal nanowire networks. The ability to lower the loading of metal in the network may allow for better overall optical properties for fused nanostructured metal networks compared to non-fused systems when compared at the same sheet resistances and for better contrast of conductivity in patterned systems. Also, as noted above, reduction of metal from the fusing solution can involve a different metal element than comprising the metal nanowire starting materials so that a metal composite structure can be formed with respect to the fused metal network involving a different metal along at the fused joints and possibly covering other portions of the network. Thus, the fused metal networks formed with reducing agents can have various differences relative to the fused metal networks formed with halide ions.

However, the fused metal nanostructured networks formed with reducing agents can have good electrical conductivity and good optical transparency, which is common with the fused metal networks formed using halide ions. The improved fused/sintered metal nanowire networks described herein can achieve simultaneously desirably low sheet resistance values while providing good optical transmission. In some embodiments, the fused metal nanowire networks can have optical transmission at 550 nm wavelength light of at least 85% while having a sheet resistance of no more than about 100 ohms/square. Optical transmission is referenced in the description and claims with the contribution of the substrate removed, and results provided in the Examiner are explained in the specific examples. In additional or alternative embodiments, the fused metal nanowire networks can have optical transmission at 550 nm of at least 90% and a sheet resistance of no more than about 250 ohms/sq. Based on the ability to simultaneously achieve good optical transparency and low sheet resistance, the fused metal nanowire films can be used effectively as transparent electrodes for a range of applications. The loading of the nanowires to form the network can be selected to achieve desired properties.

Processing can involve the use of a single solution or ink in which the fusing agents are combined with the metal nanowires, or the multiple solutions can be used, which may be deposited sequentially. In some embodiments, the metal nanowires, a metal ion source, and reducing agent can be combined as desired into two or three separate solutions. The use of multiple solutions can introduce greater control on the process, such as control of processing times or to provide for patterning. Various processing options are described in detail below. With respect to patterning, the metal nanowires can be formed into a film, and a fusing solution(s) can be applied to selected locations along the nanowire film to process the film at the selected locations into a fuse nanostructures network while leaving other locations as an unfused film. The fused films can have a very significantly lower electrical resistance compared with the unfused films such that a pattern is formed of electrically conductive regions and electrically insulating regions. The patterned films can be used for functional devices such as touch sensors or the like.

The transparent conductive films that are formed from the fused nanostructured metal networks are suitable for various applications. For example, some solar cells are designed to have an electrode along the light receiving surface, and a transparent conductive electrode may be desirable along this surface. Also, some display devices can be made with a transparent conductive electrode. In particular, touch inputs can be effectively formed with the transparent conductive films described herein, and the efficient patterning of the fused nanowire films can be used to form corresponding patterned touch sensors. As described further below, touch inputs or sensors generally operate based on change of capacitance or a change of electrical resistance upon touching of the sensor surface. Thus, the processing approaches described herein can provide significant commercial applicability for the formation of transparent conductive films.

The discovery that fused nanostructured metal networks can provide high contrast in electrical conductivity relative to unfused counterpart metal nanowire films, has provided a powerful tool for patterning of these films through patterned addition of the fusing agents. This discovery related to fused networks allows for the opportunity to provide similar patterning functions through other approaches for fusing the nanowires. In particular, radiation based fusing can be performed using patterned radiation delivery. The radiation can be selected to perform desired fusing of the nanowires without excessive damage to the substrate. In particular, infrared light can be a desirable radiation source for fusing the nanowires due to reasonable absorption by metal and low absorption by polymer substrates. Thus, the patterning approaches can be broadened to include halide based fusing agents, reduction-oxidation based fusing agents and radiation, which can each be effective to provide patterns with high contrast with respect to electrical conductivity between fused and unfused regions and with low visible differences between electrically conductive and non-conductive regions.

Metal Nanowires and Fusing Solutions

Three components, metal nanowires, a reducing agent and a metal ion source, are brought together to form the fused nanostructured metal networks in a film. In general, fusing solutions generally also comprise an acid in an appropriate concentration to stabilize the solutions, moderate the reaction and in some embodiments to etch the metal nanowires to supply metal ions. The film components are delivered to a selected substrate surface. The components can be delivered in a single or multiple solutions for application to the substrate surface. In particular, it can be desirable to form a nanowire film to which a fusing solution is added. Suitable metal ion sources can comprise metal salts that directly provide a desired metal ion for reduction to the corresponding metal or an oxidizing agent to oxidize metal from the metal nanowires as a source of metal ions for fusing the network. If a metal salt is provided, the metal ion may or may not involve the same the metal element as the metal nanowires.

In general, the nanowires can be formed from a range of metals, such as silver, gold, indium, tin, iron, cobalt, platinum, palladium, nickel, cobalt, titanium, copper and alloys thereof are desirable due to high electrical conductivity. Commercial metal nanowires are available from Blue Nano (North Carolina, U.S.A.), Seashell Technologies (California, U.S.A.) and KeChuang Advanced Materials (China). Silver in particular provides excellent electrical conductivity, and commercial silver nanowires are available. To have good transparency and low haze, it is desirable for the nanowires to have a small range of diameters. In particular, it is desirable for the metal nanowires to have an average diameter of no more than about 250 nm, in further embodiments no more than about 150 nm, and in other embodiments from about 10 nm to about 120 nm. With respect to average length, nanowires with a longer length are expected to provide better electrical conductivity within a network. In general, the metal nanowires can have an average length of at least a micron, in further embodiments, at least 2.5 microns and in other embodiments from about 5 microns to about 100 microns, although improved synthesis techniques developed in the future may make longer nanowires possible. An aspect ratio can be specified as the ratio of the average length divided by the average diameter, and in some embodiments, the nanowires can have an aspect ratio of at least about 25, in further embodiments from about 50 to about 5000 and in additional embodiments from about 100 to about 2000. A person of ordinary skill in the art will recognize that additional ranges of nanowire dimensions within the explicit ranges above are contemplated and are within the present disclosure.

The formation of the metal nanowire network comprises the formation of a dispersion of the metal nanowires in a suitable liquid and applying the dispersion as a coating onto the selected substrate surface. The concentration of the dispersion can be selected to obtain a good dispersion of the nanowires to provide for a desired degree of uniformity of the resulting coating. In some embodiments, the coating solution can comprise at least about 0.005 wt %, in additional embodiments from about 0.01 wt % to about 5.0 wt % metal nanowires, in some embodiments from about 0.02 wt % to about 4 wt %, and in further embodiments from about 0.05 wt % to about 2.5 wt % metal nanowires. A person of ordinary skill in the art will recognize that additional ranges of metal nanowire concentrations within the explicit ranges above are contemplated and are within the present disclosure. Similarly, the liquid for forming the dispersion can be selected to achieve good dispersion of the nanowires. For example, water, aqueous solvents, alcohols, such as ethanol, isopropyl alcohol or isobutyl alcohol, ketone based solvents, such as methyl ethyl ketone, organic coating solvents, such as toluene or hexane, or the like or mixtures thereof, are generally good dispersants for metal nanowires. For embodiments in which metal nanowires are deposited to first form a film prior to contacting with a fusing solution, there can be greater flexibility in selection of a liquid to disperse the nanowires since the liquid does not need to be compatible with the fusing process or fusing agents.

The fusing solution generally comprises a reducing agent, a metal ion source, and generally an acid, which can be an oxidizing acid. The fusing solution can be combined with the metal nanowires to form a single solution for forming transparent conductive files, or the fusing agent can be applied separately. Various solvents and combination of solvents can be used for the fusing solutions described herein. The table below provides a list of solvent with properties of the solvents outlined in detail, and additional solvents include, for example, methanol, butanediol, hydroxylacetone, mixtures thereof, mixtures with the solvents in the following table and mixtures of solvents listed in the table.

| Name | Structure | Boiling Point (° C.) | Density (g/cm³) | Viscosity (cP) | Polarity Index (H₂O = 9)/ Dipole Moment (D) | Surface Tension (mN/m) |
|---|---|---|---|---|---|---|
| Ethanol |  | 78 | 0.79 | 1.0 (20° C.) | 5.2 | 22.0 |
| IPA |  | 83 | 0.79 | 1.96 (25° C.) | 3.9 | 21.7 |
| 1-Butanol | 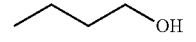 | 119 | 0.81 | 2.94 (20° C.) | 4 | 24.2 |
| 2-Butanol |  | 99 | 0.81 | 3.7 (25° C.) | <4 | 23.0 |
| Isobutanol |  | 108 | 0.80 | 3.95 (20° C.) | | |
| Propylene Glycol |  | 188 | 1.04 | 48.6 (25° C.) | | 36 |

In some embodiments, the fusing solution can comprise a metal salt or a combination thereof. In general, the metal ion in the salt can be the same metal element as the metal element of the nanowires or a different metal element. In general, the metal element can be selected as desired and corresponds with a metal having good electrical conductivity. Suitable metal ions include, for example, ions of silver ($Ag^+$), copper ($Cu^{+2}$), gold ($Au^{+3}$), palladium ($Pd^{+2}$), lead ($Pb^{+2}$), aluminum ($Al^{+3}$), nickel ($Ni^{+2}$ or $Ni^{+3}$), cobalt ($Co^{+2}$ or $Co^{+3}$), zinc ($Zn^{+2}$), iron ($Fe^{+2}$ or $Fe^{+3}$), tin ($Sn^{+2}$ or $Sn^{+4}$), or a mixture thereof. In general, the salts can comprise a halide anion, e.g. (AgF), or have an anion to provide desired solubility or reactivity. Suitable anions can comprise bases of carboxylic acids, e.g., acetate, trifluoromethane sulfonate (TMS), heptafluorobutyrate (FHB), and hexafluoroantimonate (HFA), combinations thereof or the like. The anion can correspond to an oxidizing acid, e.g., nitrate, perchlorate and/or sulfate, to provide desired functionality to the fusing solution.

With respect to metal ions, the fusing solution can comprise metal ions generally from about 0.000001M to about 1M, in further embodiments from about 0.00001M to about 0.1M, and in additional embodiments from about 0.0001M to about 0.01M. The metal ions can be generated in situ through the oxidation of metal nanowires. If the metal nanowires are mixed with the fusing solution before application to a substrate, the solution can be combined shortly before use to avoid excessive etching of the metal nanowires. A person of ordinary skill in the art will recognize that additional ranges of metal ion concentrations within the explicit ranges above are contemplated and are within the present disclosure.

The fusing solution can comprise an acid to adjust the acid concentration or pH, which in some embodiments is evaluated an alcohol solution. The acid concentration/pH may influence the reduction potentials, solubilities of reactants, solution stabilities and other properties. Generally, the fusing solutions have a pH adjusted through the addition of an acid, and the pH can be from about 0.5 to about 6, in further embodiments from about 1 to about 5.5 and in other embodiments from about 1.5 to about 5. With respect to acid concentrations, an acid, e.g., a strong acid, can be added generally in concentrations at least about 0.000001M, in further embodiments from about 0.0000025M to about 0.05M and in additional embodiments from about 0.000005M to about 0.01M. The acids may also remove at least polymer, such as polyvinylperolidone (PVP) that may be coating commercial nanowires. Suitable acids can include weakly oxidizing acids (i.e., moderate oxidizing activity from $H^+$ ions), such as HCl, phosphoric acid, carboxylic acids, or combinations thereof. Suitable strong oxidizing acids generally lower the pH while providing a significant oxidizing agent based on the anion, which can influence the potentials in the fusing solution and can be used to etch metal nanowires as a metal ion source. Suitable strong oxidizing acids include, for example, $HNO_3$ (nitric acid), $H_2SO_4$ (sulfuric acid), $HClO_4$ (perchloric acid), mixtures thereof and the like. A person of ordinary skill in the art will recognize that additional ranges of pH and acid concentrations within the explicit ranges above are contemplated and are within the present disclosure.

The reducing agent can be provided as the solvent and/or as an additive to the solvent. For example, some alcohols can be useful as a reducing agent. For the fusing solutions described herein, suitable alcohols include, for example, methanol, ethanol, isopropanol, iso-butanol, 2-butanol, propylene glycol, sugars and mixtures thereof. Ethanol can be oxidized to form acetaldehyde or acetate while reducing a metal ion to the elemental metal, and other alcohols can be similarly oxidized when functioning as a reducing agent. When a reducing agent is provided as additive to the solvent, a wide range of organic and inorganic compounds can be used. In general, the reducing power of the compound can be a not a very strong one, on the basis that a stable fusing solution is desirable. On the other hand, the reducing agent must be strong enough to reduce the silver and/or other metal ions to elemental metal under the condition of the fusing step. Inorganic and organometallic compounds, typically metal salts and complexes, can be used when they are soluble in the fusing solution solvent. Useful salts include, for example, nitrate or sulfate salts and complexes of metal ions such as $V^{2+}$, $Fe^{2+}$, $Cr^{2+}$, $Sn^{2+}$, $Ti^{3+}$, and the like. Other inorganic reducing agents useful for fusing solutions are alkaline metal, ammonium or other salts of oxidizable anions, such as sulfite, hydrosulfite, thiosulfate, phosphite, hydrogenphosphite, oxalate, or the like or combinations thereof. Furthermore, nanoparticle suspensions of reducing metal, e.g., zinc, iron, aluminum, magnesium, and the like, may be used in appropriate amount as reducing agents. The suspensions may further contain stabilizing materials, e.g., surfactant or dispersant, to aid the dispersion of the nanoparticles in solution. Organic reducing agents, in addition to those that also function as solvent, can be particularly useful in the present invention. Suitable organic reducing agents include but not limited to phenolic compounds, such as phenol, aminophenol, hydroquinone, pyrogallol, catechol, phenidone, 4-amino-3-hydroxy-1-naphthalenesulfonic acid, and the like; polyols including sugar alcohols; sugars, such as mono-saccharides and disaccharides; hydroxylamine and derivatives; aldehydes; α-hydroxy carbonyl compounds such as hydroxyketones like benzoin, furoin, hydroxyacetone; hydrazide derivatives such as phthalhydrazide, adipic acid dihydrazide, phenidone, and the like; reduced aromatic compounds such as 1-methyl-1,4-cyclohexadiene, dihydrodiazine, and the like; and combinations thereof. In general, a reducing agent can be incorporated into the fusing solution at a concentration from about 0.001 mM to about 1000 mM, in further embodiments from about 0.01 mM to about 100 mM, and in additional embodiments from about 0.1 mM to about 10 mM, and a desired concentration generally is influenced by the chemistry of a selected agent or combination of agents and a person of ordinary skill in the art can evaluate these issue empirically based on the teachings herein. A person of ordinary skill in the art will recognize that additional ranges of reducing agent concentrations within the explicit ranges above are contemplated and are within the present disclosure. If an organic additive is supplied as a reducing agent, various solvents can be suitable, such as isopropyl alcohol, isobutyl alcohol, formaldehyde, acetone, other ketones, other aldehydes, mixtures thereof, and the like.

Procedures for Forming Fused Metal Network

Fused nanostructured metal films are generally on a selected substrate surface. The formation of the films generally comprises deposition of precursor liquid(s) and fusing. A single liquid can be deposited to form the metal network, or a plurality of liquids can be used, in which one dispersion comprises metal nanowires that can be deposited and subsequently fused with a fusing agent. Processing with a single liquid generally involves deposition of a solution with dispersed metal nanowires, a metal ion source and a reducing agent. Processing with a plurality of liquids generally involves liquids that collectively still comprise metal nanowires, a metal ion source and a reducing agent, which are segregated within the two or more liquids for delivery. The use of a single liquid provides for a reduction of processing steps, while the use of a plurality of processing liquids provide some additional flexibility. For example, if a nanowire film is first deposited, a fusing solution can be added to the nanowire film, which can provide for patterning as described further below, adjustment of relative amounts of reactants, use of different solvent systems for the different solutions, use of etching acids in fusing solutions that avoids the need to mix solutions immediately prior to use and other potential options. Processing can be performed at low temperatures, such as at room temperature. Processing approaches using the fusing of nanowires as described herein can be effectively adapted to form various device components, such as touch sensors described below.

Any reasonable coating approach can be used, such as dip coating, spray coating, knife edge coating, bar coating, Meyer-rod coating, slot-die, gravure, spin coating or the like. After forming the coating with the dispersion, the nanowire network can be dried to remove the liquid. The dried film of metal nanowires can then be processed to achieve nanowire fusing.

As described in the Examples below, the processing approaches described herein result in the fusing of the metal nanowires. This fusing is believed to contribute to the enhanced electrical conductivity observed and to the improved transparency achievable at low levels of electrical resistance. The fusing is believed to take place at points of near contact of adjacent nanowires during processing. Thus, fusing can involve end-to-end fusing, side wall to side wall fusing and end to side wall fusing. The degree of fusing may relate to the processing conditions. As described further below, short processing times are believed to contribute good fusing without degradation of the nanowire network.

For the multiple solution approach, a first solution is generally deposited to form a metal nanowire film. The metal nanowire film may or may not be dried prior to further processing. A fusing solution or solutions can then be added to the metal nanowire film to perform the fusing. In some embodiments, it is believed that fusing occurs during the drying of the fusing solution in which the drying process increases metal ion concentrations. As the material dries, it is believed that liquid can pool to areas of lower chemical potential in the film between nanostructures. The films can be dried, for example, with a heat gun, an oven, a thermal lamp or the like. Generally, the films can be heated to temperatures from about 50° C. to about 100° C. during drying. After drying, the films can be washed one or more times, for example, with an alcohol or other solvent or solvent blend, such as ethanol or isopropyl alcohol, to removed excess solids to lower haze.

For single solution processing, a single coating step provides for the deposition of metal nanowires and fusing agents together. Generally, a single solution can be mixed generally no more than about 24 hours prior to use, in some embodiments no more than about 10 hours before use and in further embodiments no more than about 5 hours prior to use. In some embodiments, the solutions can be combined immediately prior to coating as part of the coating process. After forming the film, the film can be dried, and it is believed that the fusing takes place during the drying. The drying can be performed as described in the previous paragraph in the context of the separate fusing solution. The fused network can be washed one or more times, for example, with an alcohol or other solvent or solvent blend to removed excess solids.

Electrically Conductive Film Structure and Properties

The conductive films described herein generally comprise a substrate and a fused metal nanowire network deposited on a surface or portion thereof of the substrate. An optional polymer coating can be placed over the metal nanowire network to protect and stabilize the fused nanowire network. The parameters of the metal nanowires can be adjusted to achieve desirable properties for the fused network. For example, a higher loading of nanowires can result in a lower electrical resistance, but transparency can decrease with a higher nanowire loading. Through a balance of these parameters, desirable levels of electrical conductivity and optical transparency can be achieved. The nanowires in the improved networks are fused, as is observed in scanning electron micrographs. It is believed that the fusing of the nanowires results in the improved electrical conductivity while maintaining high levels of optical transparency. Having a network with fused nanowires should provide a stable electrically conductive structure over a reasonable lifetime of a corresponding product.

In general, suitable substrates can be selected as desired based on the particular application. Substrate surfaces can comprise, for example, polymers, glass, inorganic semiconductor materials, inorganic dielectric materials, polymer glass laminates, composites thereof, or the like. Suitable polymers include, for example, polyethylene terephthalate (PET), polyethylene naphthalate (PEN), polyacrylate, poly (methyl methacrylate), polyolefin, polyvinyl chloride, fluoropolymer, polyamide, polyimide, polysulfone, polysiloxane, polyetheretherketone, polynorbornene, polyester, polystyrene, polyurethane, polyvinyl alcohol, polyvinyl acetate, acrylonitrile-butadiene-styrene copolymer, polycarbonate, a copolymer thereof or blend thereof or the like. Furthermore, the material can have a polymer overcoat placed on the fused metal nanowire network, and the overcoat polymers can comprise the polymers listed for the substrates above. Moreover, other layers can be added on top or in between the conductive film and substrate to reduce reflective losses and improve the overall transmission of the stack.

Following fusing of the metal nanowires into a network, the individual nanowires are no longer present, although the physical properties of the nanowires used to form the network are directly reflected in the properties of the fused nanostructured network. As noted above the amount of nanowires delivered onto the substrate can involve a balance of factors to achieve desired amounts of transparency and electrical conductivity. While thickness of the nanowire network can in principle be evaluated using scanning electron microscopy, the network can be relatively fragile, which can complicate the measurement. In general, the fused metal nanowire network would have an average thickness of no more than about 5 microns, in further embodiments no more than about 2 microns and in other embodiments from about 25 nm to about 500 nm. However, the fused nanowire networks are generally relatively open structures with significant surface texture on a submicron scale, and only indirect methods can generally be used to estimate the thickness. The loading levels of the nanowires can provide a useful parameter of the network that can be readily evaluated, and the loading value provides an alternative parameter related to thickness. Thus, as used herein, loading levels of nanowires onto the substrate is presented as microgram or milligrams of nanowires for a square centimeter of substrate. In general, the nanowire networks can have a loading from about 0.01 milligrams (mg)/m$^2$ to about 200 mg/m$^2$, in further embodiments from about 0.025 mg/m$^2$ to about 150 mg/m$^2$, and in other embodiments from about 0.05 mg/m$^2$ to about 100 mg/m$^2$. A person of ordinary skill in the art will recognize that additional ranges of thickness and loading within the explicit ranges above are contemplated and are within the present disclosure.

Electrical resistance can be expressed as a sheet resistance, which is reported in units of ohms per square (Ω/□ or ohms/sq) to distinguish the values from bulk electrical resistance values according to parameters related to the measurement process. Sheet resistance of films is generally measured using a four point probe measurement or an equivalent process. In the Examples below, film sheet resistances were measured using a four point probe, or by making a square using a quick drying silver paste. The fused metal nanowire networks can have a sheet resistance of no more than about 200 ohms/sq, in further embodiments no more than about 100 ohms/sq, and in other embodiments no more than about 60 ohms/sq. A person of ordinary skill in the art will recognize that additional ranges of sheet resistance within the explicit ranges above are contemplated and are within the present disclosure. In general, sheet resistance can be reduced by increasing the loading of nanowires, but an increased loading may not be desirable from other perspectives as described further below, and the loading is not as significant as achieving good fusing for improving the sheet resistance.

For applications as transparent conductive films, it is desirable for the fused metal nanowire networks to maintain good optical transparency. In general, optical transparency is inversely related to the loading, although processing of the network can also significantly affect the transparency. The optical transparency can be evaluated relative to the transmitted light through the substrate. For example, the transparency of the conductive film described herein can be measured by using a UV-Visible spectrophotometer and measuring the total transmission through the conductive film and support substrate. Transmittance is the ratio of the transmitted light intensity (I) to the incident light intensity ($I_o$). The transmittance through the film ($T_{film}$) can be estimated by dividing the total transmittance (T) measured by the transmittance through the support substrate ($T_{sub}$). ($T=I/I_o$ and $T/T_{sub}=(I/I_o)/(I_{sub}/I_o)=I/I_{sub}=T_{film}$) Thus, the reported total transmissions have the transmission through the substrate removed from the values. While it is generally desirable to have good optical transparency across the visible spectrum, for convenience, optical transmission can be reported at 550 nm wavelength of light. Alternatively or additionally, transmission can be reported as total transmittance from 400 nm to 700 nm wavelength of light, and such results are reported in the Examples below. In general, for the fused metal nanowire films, the measurements of 550 nm transmittance and total transmittance from 400 nm to 700 nm (or just "total transmittance" for convenience) are not qualitatively different, although in some embodiments of transparent conductive films total transmission may be 1-2% higher than 550 nm transmission. In some embodiments, the film formed by the fused network has a total transmittance of at least 80%, in further embodiments at least about 85% and in additional embodiments, at least about 90%. Transparency of the films on a transparent polymer substrate can be evaluated using the standard ASTM D1003 ("Standard Test Method for Haze and Luminous Transmittance of Transparent Plastics"), incorporated herein by reference. As noted above, the correlation of good optical transparency with low electrical resistance can be particularly desirable. In some embodiments with a sheet resistance from 20 ohm/sq to about 150 ohm/sq, the films can have a total transmittance of at least about 86%, in further embodiments at least about 88% and in other embodiments from about 89% to about 95%. In one embodiment, the film can have a sheet resistance of no more than about 75 ohm/sq and a total transmittance of at least about 85%. In another embodiment, the film can have a sheet resistance of no more than about 175 ohm/sq and a total transmittance of at least about 90%. A person or ordinary skill in the art will recognize that additional ranges of optical transmission within the explicit ranges above are contemplated and are within the present disclosure.

The sintered metal networks can also have low haze along with high transmission of visible light while having desirably low sheet resistance. Haze can be measured using a hazemeter based on ASTM D1003 referenced above, and the haze contribution of the substrate can be removed to provide haze values of the transparent conductive film. In some embodiments, the sintered network film can have a haze value of no more than about 0.5%, in further embodiments no more than about 0.45% and in additional embodiments no more than about 0.4%. A person of ordinary skill in the art will recognize that additional ranges of haze within the explicit ranges above are contemplated and are within the present disclosure.

Patterning

The processing approaches described herein can be used for efficient patterning of films to form patterns of electrically conductive regions and less conductive regions with desirable optical transparency across the film. In particular, since the sintering/fusing process is performed chemically, the controlled delivery of the sintering agent to selected portions of a metal nanowire film can form a sintered metal network at the portions of a film contacted with the sintering agent, while the remaining portions of the metal nanowire film remain un-sintered. Of course, control of the sintering agent delivery does not have to be perfect for the patterning to be effective for appropriate applications. The patterning based on selective delivery of fusing agents along the substrate can be effective to form a pattern that is effectively invisible to the eye under white light. Based on the discovery of effective patterning based on selective fusing of a metal nanowire film, similar patterned structures can be formed using radiation based fusing of the metal nanowires in which the radiation is directed in a pattern. While patterning based on fusing the nanowires according to the selected pattern has many desirable aspects, patterning through the removal of materials or subtractive patterning can also be performed.

Figure 1A:
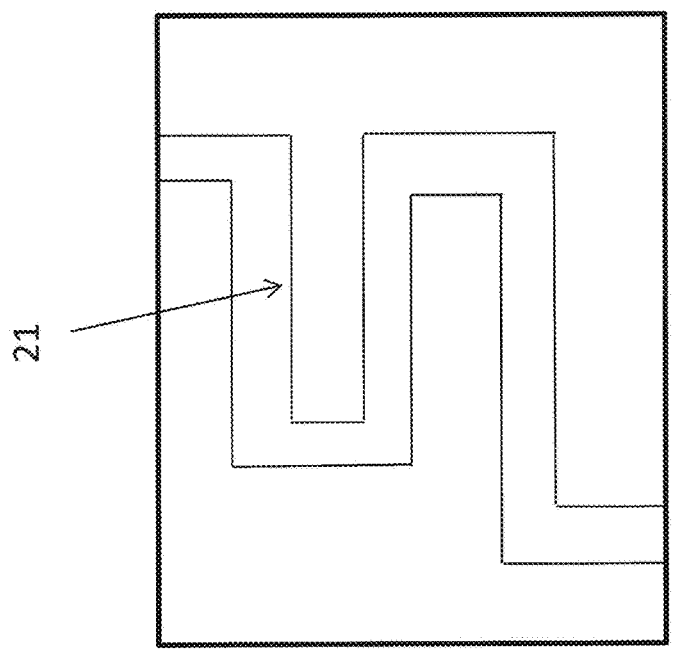
FIG. 1A is a schematic diagram showing sintered network along the substrate surface forming a conductive pattern with a single pathway.

A particular pattern of fused conductive network along the substrate surface generally is guided by the desired product. Of course, for some product, the entire surface can be electrically conductive, and for these application pattern generally is not performed. For embodiments involving patterning, the proportion of the surface comprising the electrically conductive sintered network can generally be selected based on the selected design. In some embodiments, the fused network comprises from about 1 percent to about 99 percent of the surface, in further embodiments from about 5 percent to about 85 percent and in additional embodiment from about 10 percent to about 70 percent of the substrate surface. A person of ordinary skill in the art will recognize that additional ranges of surface coverage within the explicit ranges above are contemplated and are within the present disclosure. The fused network along the surface can form a conductive pattern with a single pathway 21, as shown in FIG. 1A or with a plurality of electrically conductive pathways 23, 25, and 27, as shown in FIG. 1B. As shown in FIG. 1B, the fused area forms three distinct electrically conductive regions 23, 25, and 27. Although a single connected conductive region and three independently connected conductive regions have been illustrated in the figures, it is understood that patterns with two, four or more than 4 conductive independent conductive pathways or regions can be formed as desired. Similarly, the shapes of the particular conductive regions can be selected as desired.

The difference between the electrical conductivity of the fused network regions of the surface and the un-fused nanowire regions can provide desired functionality. In general, the variation in the electrical conductivity between the fused regions and the un-fused regions can be very large, as described in the examples, although less large contrasts can still be effective. In general, the un-fused metal nanowire regions have a sheet resistance that is at least about 10 times the sheet resistance of the fused metal network, in further embodiments at least about 100 times, in additional embodiments at least about 1000 times, and in other embodiments at least about 1,000,000 or greater times the sheet resistance of the fused metal network (e.g., up to at least $10^9$ Ohms/sq or greater). High resistance measurements can be made, e.g., on unfused networks or bare polymer substrate, by first painting silver paste onto the surface of the samples to define a square. The sample can then be annealed at roughly 120° C. for 20 minutes in order to cure and dry the silver paste. Alligator clips are connected to the silver paste, and the leads can be connected to a suitable high resistance measurement device, such as an AlphaLabs High Resistance Low Conductance Meter under electrical shielding. High resistance measurements was recorded and are described in the examples below. The instrument can measure up to 1999 gigaohm. A person of ordinary skill in the art will recognize that additional ranges within the explicit ranges above are contemplated and are within the present disclosure. The optical transparency to visible light can be approximately the same across the fused metal network and the un-fused metal nanowire film. Thus, to the eye the film may look uniform across the substrate surface in white light so that the patterning looks invisible. An invisible pattern may be desirable for some applications.

The patterning of fused and un-fused regions of the metal nanowire film can be driven by the selective delivery of the fusing agent. In general, the metal nanowire film can be first delivered to a surface. The metal nanowire film can be delivered to be relatively uniform across the surface or some appropriate portion thereof. Of course, a fraction of the surface can remain uncoated at all with nanowire film, and references to patterning refer to the portions of the surface with the nanowire film, i.e. fused and un-fused portions of the film. Patterning with halide based fusing agents is described in the '159 application cited above.

If a liquid solution comprising the fusing agent is applied to the metal nanowire film, the fusing solution can be delivered to the selected portions of the film to perform the fusing. While a well sealed mask can be used to prevent contacting of the liquid fusing agent with selected portions of the film, it can be desirable to print the liquid sintering agent along the desired portion of the film using inkjet printing, screen printing or other appropriate printing process. The properties of the liquid fusing agent can be adjusted to be appropriate for the particular printing approach. A small volume of liquid fusing agent can be delivered to provide the appropriate fusing. The liquid and/or the printing process can be controlled to limit the spreading of the fusing liquid or to have spreading controlled to provide fusing over a selected region. Moreover, conventional photolithography, such as using photoresist materials, can be used to make a mask to define regions in which the nanowires come in contact with the fusing solution.

Thermal fusing or sintering of silver nanowires can be difficult since the nanowires may not sinter until temperatures greater than the stability temperatures of polymer substrates. The use of radiation can be used to address this difficulty by directing the radiation into the silver nanowires while the polymer substrate may be relatively transparent to the radiation so that the thermal load on the substrate is reduced. A report of laser ablation of silver nanowires is reported in Pothoven, "Laser Patterning of Silver Nanowires," Information Display Magazine, Vol. 28 (9), September 2012, electronic article, incorporated herein by reference. While the laser ablation of the nanowires resulted in relatively modest damage to the substrate, the fusing of the nanowires can be performed with a significantly lower radiation dose, which should further reduce the radiation damage to the substrate for many substrates. While ultraviolet, visible and/or infrared light can be used to fuse the metal nanowires, infrared can be desirable due to generally reduced damage to the substrate. A range of lasers are available with selected wavelengths, such as excimer lasers or YAG lasers, to pattern the radiation fusing of the film, and laser control systems can be used to scan the beam to selected locations. A commercial system to directed the scanned laser include, for example, a ScanLabs scanners. Also, high intensity infrared lamps, such as noble gas based flash lamps, can be directed at the film to perform the sintering, and a mask can be used to define the pattern. The use of high intensity heat lamps to perform a rapid thermal anneal on semiconductor devices is described in U.S. Pat. No. 5,665,639 to Seppala et al., entitled "Process for Manufacturing a Semiconductor Device Bump Electrode Using a Rapid Thermal Anneal," incorporated herein by reference, and such devices can be adapted for metal nanowire fusing.

With respect to subtractive patterning, metal is removed from regions identified to have high electrical resistance. Removal of metal can be performed effectively following fusing of the nanowires into a fused network over the surface, although in some embodiments removal of metal nanowires prior to fusing or after patterned fusing can be performed. If removal of metal nanowires for patterning is done prior to fusing, the fusing agent may then be applied over the whole patterned surface since the high resistance areas can be substantially free of metal nanowires. The removal of metal from regions in which a high electrical resistance is desired can be performed through etching or with radiation. To perform wet chemical etching, a patterned mask can be applied, for example, using conventional photolithography and a photoresist. Suitable wet etching agents to remove metal nanowires can include, for example, 8M nitric acid or 3M cupric chloride/hydrochloric acid. With a positive photoresist, the applied photoresist is exposed and developed to expose regions for etching, and following etching, the photoresist is removed. For radiation based removal of the metal, radiation can be used similarly to the fusing of metal nanowires with radiation described above, except that an appropriately higher radiation dose is delivered to remove the metal rather than fusing the metal. In particular, an infrared laser or an infrared heat lamp can generally provide ablation for the metal with reduced damage to the substrate relative to some ablation approaches. Scanning of a laser beam or masking the radiation can be used to define the patterning with the radiation. Subtractive patterning can produce regions with surface resistances on the order of $10^7$ to $10^9$ or greater ohms/sq.

The efficient patterning of the conductive transparent film can be very effective for certain display and or touch sensor applications. In particular, a touch sensor may desirably have patterns of electrically conductive regions to provide for a corresponding pattern of touch sensors, and the transparency provides for the visualization of a display or the like under the pattern as shown below.

Touch Sensors

A common feature of the touch sensors generally is the presence of two transparent conductive electrode structures in a spaced apart configuration in a natural state, i.e., when not being touched or otherwise externally contacted. For sensors operating on capacitance, a dielectric layer is generally between the two electrode structures. Referring to FIG. 2A, a capacitance based touch sensor 101 comprises a display component 103, an optional bottom substrate 105, a first transparent conductive electrode structure 107, a dielectric layer 109, such as a polymer or glass sheet, a second transparent conductive electrode structure 111, optional top substrate 113, and measurement circuit 115 that measures capacitance changes associated with touching of the sensor. Referring to FIG. 2B, a resistance based touch sensor 131 comprises a display component 133, an optional lower substrate 135, a first transparent conductive electrode structure 137, a second transparent conductive electrode structure 139, support structures 141, 143 that support the spaced apart configuration of the electrode structures in their natural configuration, upper substrate 145 and resistance measuring circuit 147.

Display components 103, 133 can be LED based displays, LCD displays or other desired display components. Substrates 105, 113, 135, 145 can be transparent polymer sheets or other transparent sheets. Support structures can be formed from a dielectric material, and the sensor structures can comprise additional supports to provide a desired stable device. Measurement circuits 115 and 147 are known in the art, and some specific sensor embodiments are referenced below in the context of patterning. Transparent conductive electrodes 107, 111, 137 and 139 can be effectively formed using sintered metal networks, although in some embodiments the sintered metal networks form some electrode structures while other electrode structures in the device can comprise materials such as indium tin oxide, aluminum doped zinc oxide or the like. Fused metal networks can be effectively patterned as described herein, and it can be desirable for incorporate patterned films in one or more of the electrode structures to form the sensors such that the plurality of electrodes in a transparent conductive structure can be used to provide position information related to the touching process. The use of patterned transparent conductive electrodes for the formation of patterned touch sensors is described, for example, in U.S. Pat. No. 8,031,180 to Miyamoto et al., entitled "Touch Sensor, Display With Touch Sensor, and Method for Generating Position Data," and published U.S. patent application 2012/0073947 to Sakata et al., entitled "Narrow Frame Touch Input Sheet, Manufacturing Method of Same, and Conductive Sheet Used in Narrow Frame Touch Input Sheet," both of which are incorporated herein by reference.

EXAMPLES

Commercial silver nanowires with different sizes were used in the following examples. The properties of the silver nanowires had an average diameter of between 30 and 40 nm and an average length of 10-15 microns. The silver nanowires (AgNWs) films were formed using the following procedure. Commercially available silver nanowires (AgNWs) were dispersed in solvent to form an AgNWs dispersion. The AgNWs dispersions were typically in the 0.1-1.0% wt range in an alcohol solvent. The dispersion was then deposited on glass or polyethylene terephthalate (PET) surfaces as an AgNWs film using a spray coating or a hand-drawn rod approach. The AgNWs film was then exposed briefly to selective fusing agent to form fused metal nanostructured networks. One ink or two ink systems were also developed that mixed AgNWs with fusing agents directly in ink solution.

The total transmission (TT) and haze of the AgNWs film samples were measured using a Haze Meter with films on a polymer substrate. The haze from the PET substrate alone was about 0.4%. To adjust the haze measurements for the samples below, a value of 0.4% can be subtracted from the measurements to get approximate haze measurements for the transparent conductive films alone. The instrument is designed to evaluate optical properties based on ASTM D 1003 standard ("Standard Test Method for Haze and Luminous Transmittance of Transparent Plastics"), incorporated herein by reference. The total transmission and haze of these films include PET substrate which has base total transmission and haze of ~93.3% and 0.3%-0.4%, respectively. Sheet resistance was measured with a 4-point probe method unless indicated otherwise. In the following examples, several different solution sintering agents are presented. The transparent conductor properties before and after sintering (especially) and the sheet resistance of the films are provided. The network of nanowires can be composed of silver and some polymers which may serve as an ink dispersant or binder. Representative high resistance measurements were performed on the unfused metal nanowire films formed for these examples. To make the measurements, a square of silver paste was painted onto the surface of the samples to define a square, which were then annealed at roughly 120° C. for 20 minutes in order to cure and dry the silver paste. Alligator clips were connected to the silver paste, and the leads can be connected to a suitable high resistance measurement device. Three representative measurements were >1000 gigaohm/sq. ($10^{12}$ ohm/sq.), 1000 gigaohm/sq and 100 gigaohm/sq ($10^{11}$ ohm/sq).

Example 1—Fusing Compositions with Different Silver Sources, Acids and Solvents

This example test the fusing ability of different silver sources combined with several acids in different alcohols as fusing agents. All acids used were at ~0.01-1.0 μL/mL (0.001-1.0 Vol % i.e. Vol/Vol or 0.00157M to 0.157M), and all silver salts used were at 1.0 mg/mL. The composition of fusing agents 1-10 are listed in Table 2 below. The fusing agents were applied to AgNWs films and the properties of the films before and after the fusing agent application are compared in Table 2, with films 4, 6, and 7 being control that comprise no acid or silver salt. AgNWs inks were created in isopropyl alcohol or isobutyl alcohol or other solvents at 0.01-0.5 wt %. The inks were then coated using a Meyer rod or blade coating. The films were quickly dried with a heat gun or IR lamp for a few seconds to flash off solvents. The fusing solution was then deposited using spray or blade coating. After the coating, the films were quickly dried using the heat gun or IR lamp to dry the solvent. Equivalent silver nanowire films were used to test fusing solutions for Examples 1-9.

Figure 3:
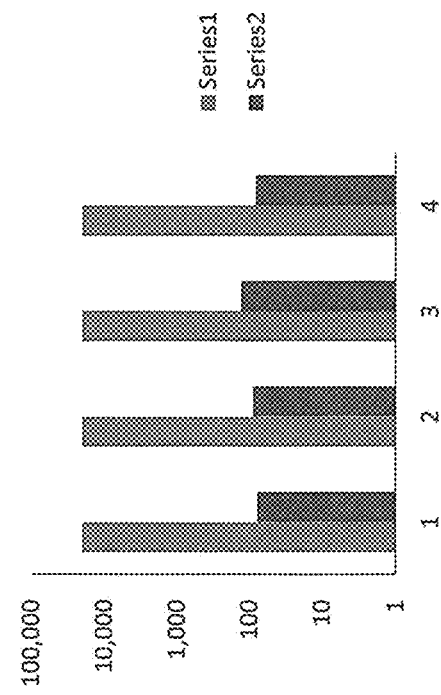
FIG. 3 is a logarithmic scale plot of resistance data of films 1-10 from example 1.
Figure 3A:
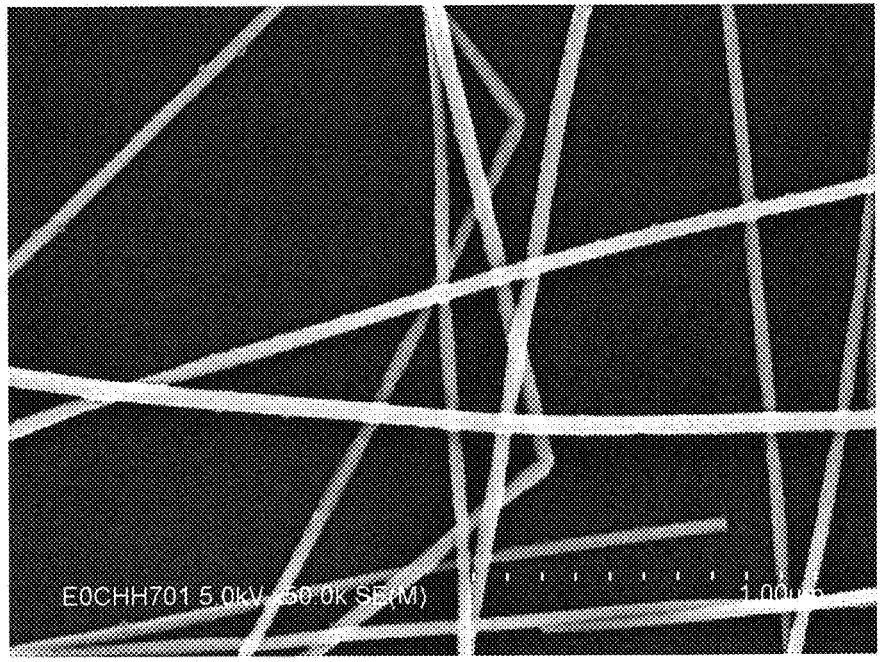
FIG. 3a is a composite of SEM images, taken at different magnifications, of the surface of an AgNW film representative of film sample 5 in Example 1.
Figure 3A:
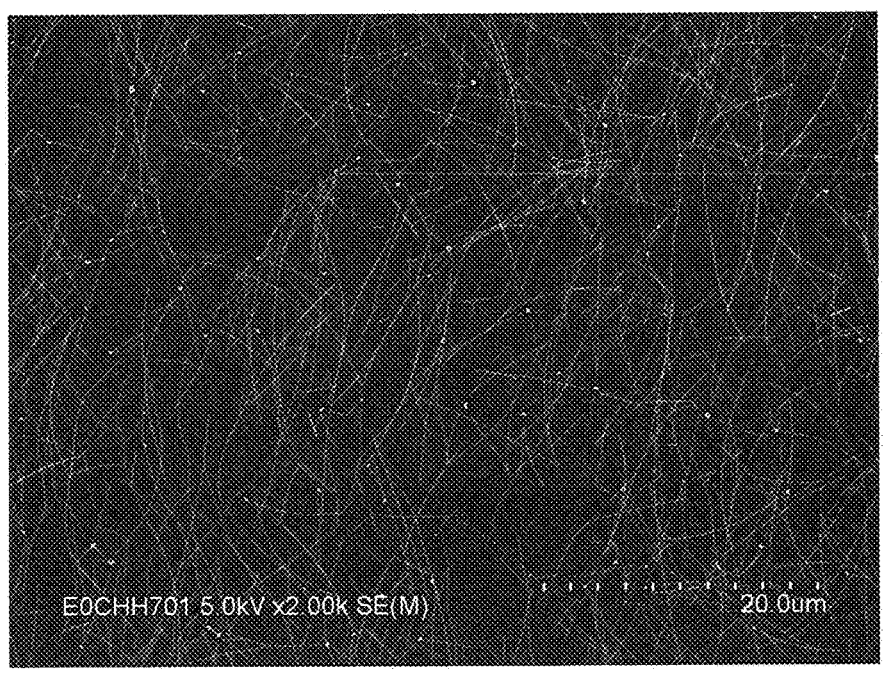

The resistances of the films 1-7 were measured and the results plotted in FIG. 3. As shown in FIG. 3, composition 1 appeared to cause no fusing as the resistance of the film remained high. Films treated with compositions 2, 3, 4, 5, 6, and 7 all showed significantly reduced resistance, indicating fusing or sintering has occurred in these film samples. FIG. 3a is a composite of SEM images, taken at different magnifications, of the surface of a film representative of film sample 5 and shows fusing or sintering of the nanowires. Fusing composition 7 in particular contained only 1.0 ul/mL nitric acid in ethanol without an added silver salt, and was able to sinter the nanowires successfully as indicated by the reduction in resistance. In particular, prior to sintering film 7 had a resistance of greater than 20,000 ohm/sq. Following sintering, film 7 had a resistance of about 150 ohm/sq. Since sample 7 only has the silver nanowires as a metal source, this example demonstrated that an oxidizing acid, e.g., nitric acid, can mobilize the metal and induce fusing of adjacent nanowires into a fused network.

TABLE 2

| | Solution | Ag$^+$ source | Sinter |
|---|---|---|---|
| 1 | HF in EtOH | NONE | NO |
| 2 | AgNO$_3$ in HF (EtOH) | Yes (NO$_3$) | YES |
| 3 | AgF HF (EtOH) | Yes (F) | YES |
| 4 | AgNO$_3$ in IPA | Yes (NO$_3$) | YES |
| 5 | AgF & HNO$_3$ in EtOH/H$_2$O (80:20 v:v) | Yes (F) | YES |
| 6 | AgNO$_3$ + AgF in EtOH | Yes (NO$_3$) and (F) | YES |
| 7 | HNO$_3$ in EtOH | NONE | YES |

Example 2 Nitric Acid in Ethanol as Fusing Solution

Figure 4:
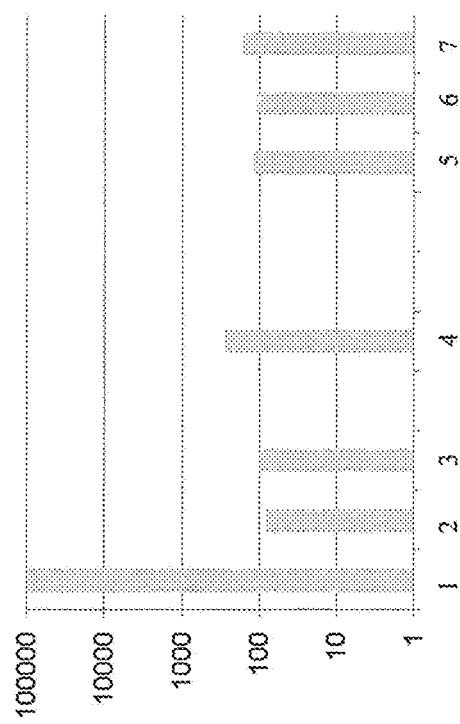
FIG. 4 is a logarithmic scale plot of resistance data of films from example 2 before and after the application of sintering solution.

The sintering ability of nitric acid in ethanol as fusing agent is further tested in this example. Specifically, solutions containing ~0.01-1.0 uL/mL nitric acid in EtOH were cast by blade coating onto dry AgNW films that were formed by blade coating AgNW dispersions onto the substrate. Four replicate film samples were formed. The resistance of the films before and after the application of the sintering solution was measured and the results plotted in FIG. 4. The variation in resistance was likely due to variations in the films or the corresponding dispersions, and/or the coating quality. As shown in FIG. 4, the initial resistances of the films were as high as 20,000 ohm/sq while the corresponding sintering solution treated films showed resistance to the right of between 80-140 ohm/sq, with >90 Total Transmission (TT) (including the PET substrate) and low haze. Since the PET substrate has a TT of roughly 93%, the TT of the conductive film was correspondingly higher. It should be noted that initial resistance of these samples prior to the treatment may be much greater than the recorded 20,000 ohm/sq but is out of the detection range for the hand held four-point probe used. Significant reduction in resistance in the films therefore was observed accompanied by retention of high TT and low haze.

Example 3 Silver Nitrate and Nitric Acid in Ethanol as Fusing Solution

Figure 4A:
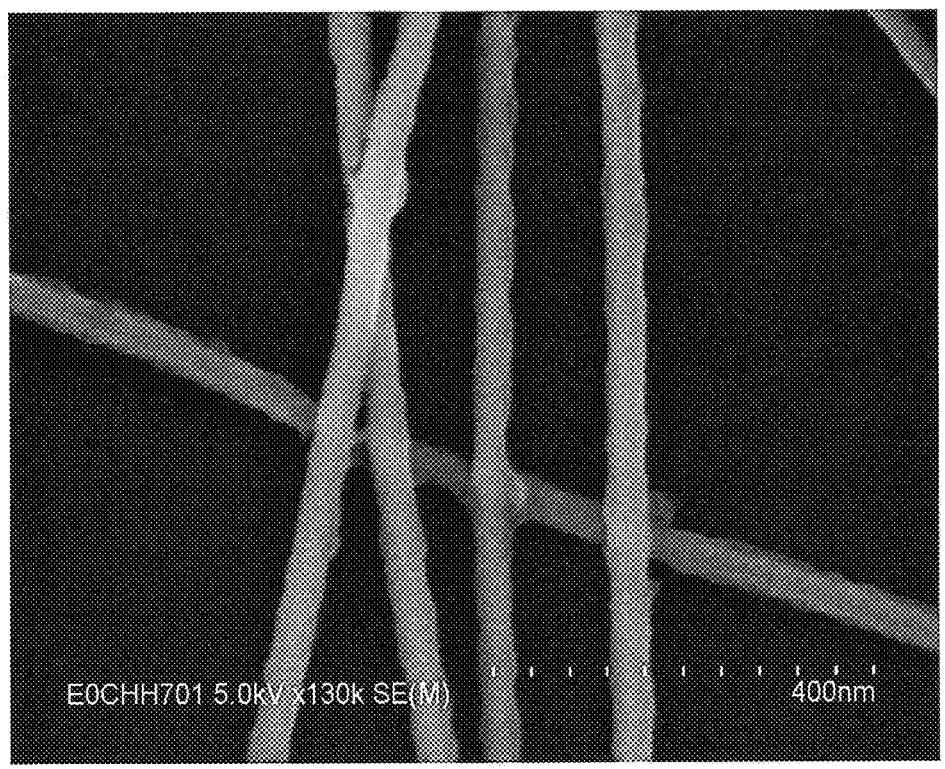
FIG. 4a is an SEM image of the surface of an AgNW film representative of films 1 and 2 in Example 3.

The sintering ability of silver nitrate and nitric acid in ethanol as fusing agent is tested in this example. AgNW films 1-6 were cast from a 0.01-0.5 wt % solution. Fusing solution containing 0.1 mg/ml AgNO$_3$ and 1.6 uL/mL HNO$_3$ in EtOH were applied to the films. The resistance, total transmission and Haze include PET of the films were measured and the results listed in Table 3 below. As shown in Table 3, the initial resistances of the networks of AgNW films 1-6 were shown to be higher than 20,000 ohm/sq. After treatment with the fusing solution, the AgNW films 1-6 were shown to have resistance between 75-203 ohm/sq, with >90 Total Transmission (TT) (including the PET substrate) and low haze. Since the PET substrate has a TT of roughly 93%, the TT of the conductive film was correspondingly higher. Significant reduction in resistance in the films therefore was observed accompanied by retention of high TT and low haze. Relative to corresponding film samples formed without AgNO$_3$ (not shown), the results presented in Table 3 were generally more consistent. FIG. 4a is a composite of SEM images of different portions of a film representative of films 1 and 2 in Table 3. The SEM images demonstrate sintering of AgNW.

TABLE 3

|   | Before (ohm/sq) | After (ohm/sq) | Final TT (%) | % Haze |
|---|---|---|---|---|
| 1 | >20,000 | 203 | 91.4 | 1.11 |
| 2 | >20,000 | 203 | 92.1 | 0.98 |
| 3 | >20,000 | 75 | >90.0 | 1.51 |
| 4 | >20,000 | 174 | >90.0 | 1.24 |
| 5 | >20,000 | 100 | >90.0 | 1.11 |
| 6 | >20,000 | 111 | 92.9 | 0.83 |

Example 4 Fusing Compositions with Different Silver Sources in Ethanol

This example tests the fusing ability of different silver sources combined with nitric acid or perchloric acid in ethanol. All silver sources were 0.1 mg/ml and all acids were 1.6 uL/mL in EtOH. The silver sources used include AgF, Ag-Acetate, Ag-trifluoromethane sulfonate (AgTMS), Ag-Heptafluorobutyrate (AgFHB), and Ag-Hexafluoroantimonate (AgHFA). The fusing reagents used, the resistance, total transmission and haze include PET of the films were measured and the results listed in Tables 4 and 5 below. As shown in Tables 4 and 5, the initial resistances of the AgNW films were shown to be higher than 20,000 ohm/sq. After treatment with the fusing agents, the AgNW films were shown to have resistance between 50-200 ohm/sq with the exception of $AgBF_4$ treated film which as a resistance of 500 ohm/sq. The total transmission of (TT) films after the treatment appear to be higher than 91 with low haze with the exception of perchloric acid—$AgHClO_4$ treated film which has a haze of 11.4. Significant reduction in resistance in the most of the films therefore was observed accompanied by retention of high TT and low haze.

TABLE 4

| Silver Source | Acid | ohm/sq Before | ohm/sq After | Final TT | Final Haze |
|---|---|---|---|---|---|
| AgF | $HNO_3$ | >20,000 | 110 | 91.7 | 1.14 |
| Ag-Acetate | $HNO_3$ | >20,000 | 150 | 91.5 | 1.33 |
| Ag-TMS | $HNO_3$ | >20,000 | 75 | 91.8 | 0.93 |
| AgFHB | $HNO_3$ | >20,000 | 90 | 91.5 | 0.96 |
| AgHFA | $HNO_3$ | >20,000 | 110 | 91.1 | 1.07 |
| $AgBF_4$ | $HNO_3$ | >20,000 | 500 | 91.7 | 1.5 |
| $AgHClO_4$ | $HClO_4$ | >20,000 | 200 | 92.5 | 11.4 |

TABLE 5

| Silver Source | Acid | ohm/sq Before | ohm/sq After | Final TT | Final Haze |
|---|---|---|---|---|---|
| AgHFB | $HNO_3$ | >20,000 | 103 | 92.4 | 0.88 |
| AgHFB | $HNO_3$ | >20,000 | 108 | 92.5 | 1.05 |
| AgHFB | $HNO_3$ | >20,000 | 50 | 92.1 | 1.24 |
| AgTMS | $HNO_3$ | >20,000 | 95 | 92.0 | 1.03 |
| AgTMS | $HNO_3$ | >20,000 | 100 | 92.2 | 0.91 |
| AgTMS | $HNO_3$ | >20,000 | 103 | 92.2 | 0.92 |

Example 5 Comparison of Silver Nitrate and Silver Fluoride in Ethanol as Fusing Agents This example compares the fusing ability of silver nitrate and silver fluoride when combined with nitric acid in ethanol as fusing agents on different AgNW films. AgNW films were cast from a 0.01-0.5 wt % solution. Fusing agent used was 0.1 mg/ml AgF or $AgNO_3$ and 1.6 uL/mL $HNO_3$ in EtOH. Four replicate film samples were made using AgF as a fusing agent and four replicate samples were made using $AgNO_3$ as a fusing agent. The sintering reagents used in each film sample and the corresponding resistance, total transmission and haze include PET of the films were measured and the results listed in Table 6 below. The differences between like film samples were likely due to variations in coating or the quality of the AgNW dispersion prior to coating. As shown in Table 6, the initial resistances of the AgNW films were shown to be higher than 20,000 ohm/sq. After treatment with the fusing agents, the AgNW films were shown to have resistance less than 150 ohm/sq for AgF treated films and less than 100 ohm/sq for $AgNO_3$ treated films. The total transmission of (TT) films after the treatment appears to be higher than 91% for AgF treated films and higher than 92% for $AgNO_3$ treated films with low haze of less than 1.4% for AgF treated films and less than 1.02% for $AgNO_3$ treated films. Although significant reduction in resistance in the films therefore was observed accompanied by retention of high TT and low haze were observed in both silver nitrate and silver fluoride, silver nitrate appeared to produce films with lower resistance, higher TT and lower haze.

TABLE 6

| Silver Source | Acid | ohm/sq Before | ohm/sq After | Final TT | Final Haze |
|---|---|---|---|---|---|
| AgF | $HNO_3$ | >20,000 | <150 | 91.2 | 1.35 |
| AgF | $HNO_3$ | >20,000 | <150 | 91.7 | 1.16 |
| AgF | $HNO_3$ | >20,000 | <150 | 91.4 | 1.26 |
| AgF | $HNO_3$ | >20,000 | <150 | 91.5 | 1.37 |
| $AgNO_3$ | $HNO_3$ | >20,000 | <100 | 92.5 | 1.00 |
| $AgNO_3$ | $HNO_3$ | >20,000 | <100 | 92.5 | 1.02 |
| $AgNO_3$ | $HNO_3$ | >20,000 | <100 | 92.5 | 0.88 |
| $AgNO_3$ | $HNO_3$ | >20,000 | <100 | 92.5 | 0.99 |

Example 6 Palladium Sintering Solutions

This example demonstrates the ability to fuse metal nanowires with a metal element different from the metal of the nanowires. Palladium sintering solutions therefore were tested as fusing agent in this example.

Palladium (Pd) salts were made 0.0005-0.005 molar in Ethanol. $HNO_3$ was added 1.0 uL/mL. The fusing reagents used in each film sample and the corresponding resistance and total transmission including PET of the films were measured and the results listed in Table 7 below. Since the PET substrate has a TT of roughly 93%, the TT of the conductive film was correspondingly higher. As shown in Table 7, the initial resistances of the AgNW films were shown to be higher than 20,000 ohm/sq. After treatment with the fusing agents, although the resistance of the films has been significantly decreased, it is still high compared to after the treatment by other fusing agents. Only $Pd(NO_3)_2$ with nitric acid treated film was shown to have resistance less than 150 ohm/sq. Using $Pd(NO_3)_2$ with nitric acid as fusing agent has been explored further as described below in Example 6.

TABLE 7

| Palladium Source | Acid | ohm/sq Before | ohm/sq After | Final TT |
|---|---|---|---|---|
| $K_2PdCl_4$ | NONE | >20,000 | 1,130 | 86.8 |
| $K_2PdCl_4$ | $HNO_3$ | >20,000 | 880 | 85.9 |
| $Pd(NO_3)_2$ | NONE | >20,000 | 235 | 90.2 |
| $Pd(NO_3)_2$ | $HNO_3$ | >20,000 | 140 | 91.1 |

Example 7 Other Metal Sintering Solutions

Figure 5:
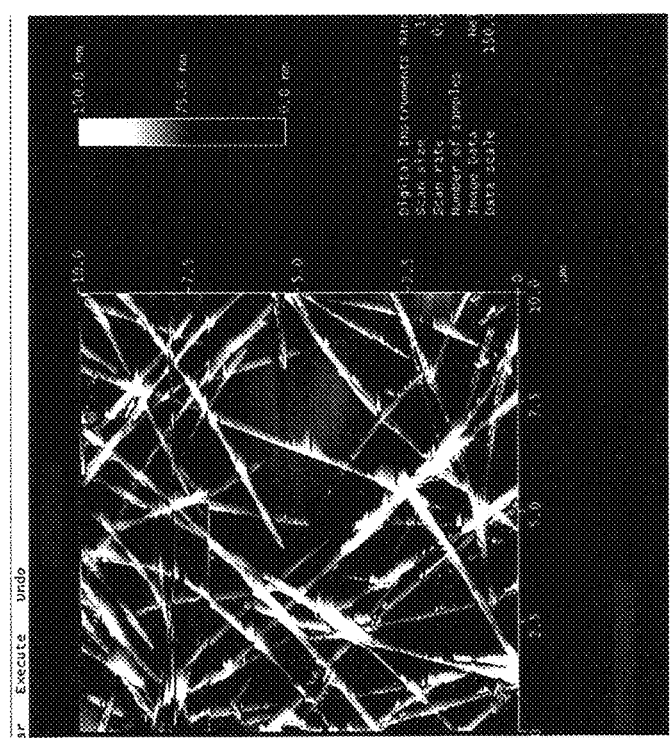
FIG. 5 is an atomic force microscopy image of AgNW network formed with sample Pd3 of Example 7.
Figure 5A:
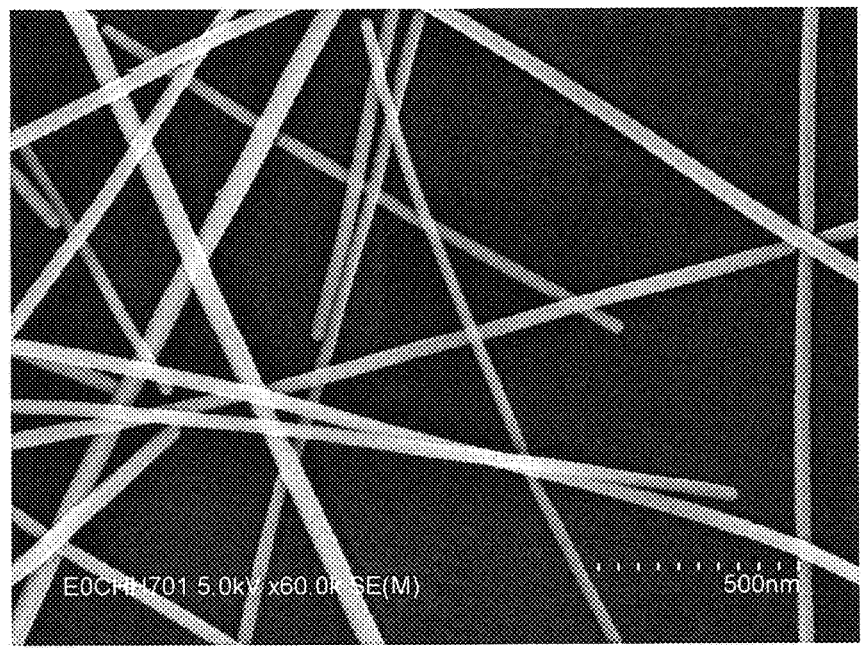
FIG. 5a is a composite of SEM images, taken at different magnifications, of the surface of an AgNW film representative of sample Pd1 in Example 7.
Figure 5A:
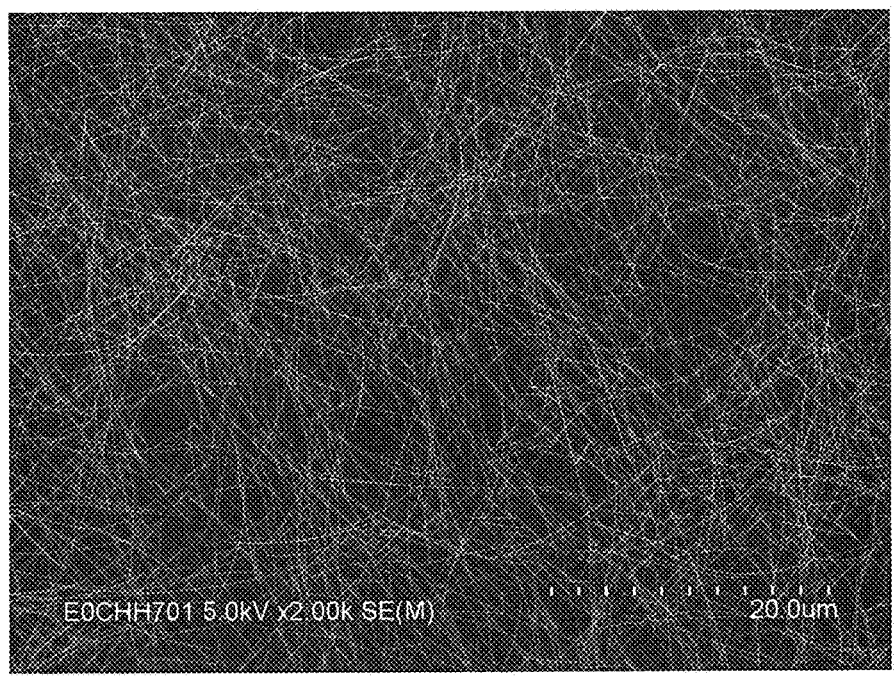

Metal sources other than silver such as palladium and copper were used in this example as fusing agents. Palladium (Pd) or copper salts were made 0.00005-0.005 molar in ethanol. $HNO_3$ was added 1.6 µL/mL. For fusing solutions Pd2 and Pd4, 0.1 mg/mL AgF was added additionally to form the sinter solution. The fusing agents used in each film and the corresponding resistance, total transmission and haze include PET of the films were measured and the results listed in Table 8 below. The initial resistances of the AgNW films were higher than 20,000 ohm/sq. The resistance after the treatment was an average obtained from three data points. As shown in Table 8, after treatment with the fusing agents, the AgNW films were shown to have resistance between 32 and 117 ohm/sq. The total transmission of (TT) films after the treatment appears to be between 88 and 91 including the PET substrate. The Veeco AFM instrument was used and 10×10 µm scans were captured of the AgNW network formed with the sample Pd3 was conducted and shown in FIG. 5, indicating clear growth of the nanowire network. FIG. 5a is a composite of SEM images, taken at different magnifications, of the surface of a film representative of sample Pd1 in table 8 and shows fusing or sintering of the nanowires.

TABLE 8

| | Sinter Solution | Resistance (Ohm/sq) | % TT |
|---|---|---|---|
| Pd1 | $5 \times 10^{-4}$ $Pd(NO_3)_2$ + 1.6 ul/ml $HNO_3$ | 41 | 89.7 |
| Pd2* | $5 \times 10^{-4}$ $Pd(NO_3)_2$ + 1.6 ul/ml $HNO_3$ + AgF | 32 | 88.7 |
| Pd3 | $5 \times 10^{-5}$ $Pd(NO_3)_2$ + 1.6 ul/ml $HNO_3$ | 117 | 90.6 |
| Pd4* | $5 \times 10^{-5}$ $Pd(NO_3)_2$ + 1.6 ul/ml $HNO_3$ + AgF | 33 | 90.3 |
| Cu1 | $5 \times 10^{-3}$ $Cu(NO_3)_2$ + 1.6 ul/ml $HNO_3$ | 65 | 88.7 |

Example 8 Comparison of Copper and Silver Salts

Copper is used as the metal salt in the sintering solution and compared to silver salt in this example. The fusing reagents used in each film sample and the corresponding resistance, total transmission and haze include PET of the films were measured and the results listed in Table 9 below. The initial resistances of the AgNW films were higher than 20,000 ohm/sq. The resistance after the treatment was an average obtained from three data points. It took about 10 mins to form the sintered network using the copper solution comprising ethanol.

TABLE 9

| | Metal Used | Sinter Solution | Ohm/sq | % TT | Haze |
|---|---|---|---|---|---|
| Cu1a | Copper | $5 \times 10^{-4}$ molar $Cu(NO_3)_2$ + 1.6 µl/ml $HNO_3$ | 78 | 90.1 | 1.63 |

TABLE 9-continued

| | Metal Used | Sinter Solution | Ohm/sq | % TT | Haze |
|---|---|---|---|---|---|
| Control | Silver | 0.1 mg/ml $AgNO_3$, 1.6 µl/ml $HNO_3$ | 63 | 90.8 | 1.58 |

Copper solutions showed similar performance as silver based ($AgNO_3$, $HNO_3$ system). Better haze and optics for Cu compared to previous experiment was obtained by reducing the concentration of copper used by ten fold. The AFM of the AgNW network formed with the diluted copper solution ($5 \times 10^{-4}$ $Cu(NO_3)_2$) was conducted and shown in FIG. 6, indicating clear growth of the nanowire network.

Example 9 Gold and Lead Used in Fusing Solutions

Gold and Lead were used as the metal salt in the fusing solution in this example. The fusing reagents used in each film sample and the corresponding resistance, total transmission and haze include PET of the films were measured and the results listed in Table 10 below. The initial resistances of the AgNW films were higher than 20,000 ohm/sq. The resistance after the treatment was an average obtained from three data points. The fusing solution containing gold appeared to lift the AgNW off the base PET. No resistance was obtained for the film after treatment with gold containing fusing solution. This is believed to be due to poor adhesion of the resulting film, and not an inherent property of the gold based fusing solutions. The resistance of the film after lead treatment appears to be relatively high, about 316 ohm/sq. The lead treated film appeared to have good TT and low haze.

TABLE 10

| | Metal | Sinter Solution | Resistance | % TT | Haze |
|---|---|---|---|---|---|
| Au1 | Gold | $1 \times 10^{-3}$ molar $HAuCl_4$ + (10 µl $HNO_3$/ml Ethanol) | n.a. | 89.8 | 0.87 |
| Pb1 | Lead | $1 \times 10^{-3}$ molar Pb*Acetate+ $HNO_3$ | 316 | 90.2 | 1.21 |

Example 10 One Ink Solution Fusing

This experiment explores the process of mixing fusing agents and AgNW ink together in solution and coat out on to a base substrate such as PET. Several organic and alcohol based solvents were used. The one ink in general refers to systems where the fusing agents have been integrated into the ink. The reducing agent used in these embodiments is generally the solvent, or a reducing agent can be added into the fusing solution. A summary of the various kinds of chemicals and mechanisms used for fusing has been provided. Many volume/concentration ratios were screened, in some cases small volumes of fusing solution (FS) was added into the AgNW ink; in other cases AgNWs was added directly to fusing solution (FS). Three sintering solutions (FS) were explored: CT1) AgF (0.1 mg/ml)+$HNO_3$ (1.6 uL/ml); CT2) $AgNO_3$ (0.1 mg/ml)+$HNO_3$ (1.6 uL/ml); and CT3) Plated out AgF (1.0 mg/ml in EtOH which was bath sonicated for 30 mins and then filtered through either 0.45 or 0.2 um PTFE filters). Because $HNO_3$ can etch AgNW, it is therefore important to make solutions CT1 and CT2 right before the coating process. AgNW dispersion were prepared that has a concentration of 0.01-0.5 weight percent in ethanol or isopropyl alcohol. The fusing solutions were also prepared in the ethanol in specified concentrations. Isopropyl alcohol (IPA) is used as a diluting solvent. The ratio of AgNW/IPA/FS in mL are specified in tables 10-12 below. The resistance of the films after the treatment was an average obtained from three data points.

AgF+HNO$_3$ (CT1) Dilutions into AgNW Ink

Fusing solution (FS) CT1 was added to the AgNW suspension to replace partially or all of the IPA diluents as specified in the Table 11 below. The first sample contained no FS and HCl vapor was used as the fusing agent to serve as a control. As shown by the performance data in Table 11, when concentration of the FS is equivalent to over-coat concentrations (i.e. the concentrations used to coat the fusing solution on top of an unfused network), similar resistance, TT, and haze value was achieved in sample 5 as compared to the control sample 1. Adding small amounts of sintering agents contained in CT1 therefore does appear to fuse the AgNWs to form the nanostructured network, as evidenced by the improvement in the resistance of the AgNW films. The removal of the IPA diluent resulted in results similar to the HCl vapor control. FIG. 6a is a composite of SEM images, taken at different magnifications, of the surface of a film representative of film sample 1 and shows fusing or sintering of the nanowires.

TABLE 11

| | AgNW/IPA/FS (ml) | Ink Composition | Ohm/sq | % TT/ Haze |
|---|---|---|---|---|
| 1 | 0.2/0.9/0 | Dilution Control and HCl Vapor | 99 | 91.0/1.17 |
| 2 | 0.2/0.81/0.09 | Reduce IPA 10% and add 10% CT1 | — | 91.6/1.36 |
| 3 | 0.2/0.675/0.225 | Reduce IPA 25% and add 20% CT1 | 2500 | 91.3/1.43 |
| 4. | 0.2/0.450/0.450 | Reduce IPA 50% and add 50% CT1 | 694 | 91.6/1.42 |
| 5 | 0.2/0/0.9 | Reduce IPA 100% and use AgNW in CT1 | 137 | 91.5/1.21 |

AgNO$_3$+HNO$_3$ (CT2) Dilutions into AgNW Ink

Fusing solution (FS) CT2 was added to the AgNW suspension to replace partially or all of the IPA diluents as specified in the Table 12 below. The first sample contained no FS and HCl vapor was used as the sintering agent to serve as a control. As shown by the performance data in Table 12, when concentration of the FS is equivalent to over-coat concentrations, similar resistance, TT, and haze value was achieved in sample 5 as compared to the control sample 1. Adding small amounts of sintering agents contained in CT2 therefore does appear to fuse the AgNWs to form the nanostructured network, as evidenced by the improvement in the resistance of the AgNW films. This approach could potentially significantly lower the haze of the treated film as only one coat was coated onto the substrate compared to the film with an additional over coat of sintering solution. For these solutions, removal of all of the IPA diluent resulted in a lower sheet resistance and a lower haze relative to the HCl vapor control with a small decrease in % T. FIG. 6b is a composite of SEM images, taken at different magnifications, of the surface of a film representative of the films formed with CT2 in Table 12, however, having a sheet resistance of about 200 Ohm/sq. FIG. 6b demonstrates significant sintering or fusing of the nanowires.

TABLE 12

| | AgNW/IPA/FS (ml) | Ink Composition | Ohm/sq | % TT/Haze |
|---|---|---|---|---|
| 1 | 0.2/0.9/0 | Dilution Control and HCl Vapor | 115 | 91.6/1.69 |
| 2 | 0.2/0.81/0.09 | Reduce IPA 10% and add 10% CT2 | — | 91.6/1.21 |
| 3 | 0.2/0.675/0.225 | Reduce IPA 25% and add 20% CT2 | — | 91.4/1.24 |
| 4. | 0.2/0.450/0.450 | Reduce IPA 50% and add 50% CT2 | 6603 | 91.4/1.33 |
| 5 | 0.2/0/0.9 | Reduce IPA 100% and use AgNW in CT2 | 86 | 90.9/1.40 |

Filtered AgF (CT3)

Fusing solution (FS) CT3 containing only 0.01-0.1 weight percent AgF without the acid was added to the AgNW suspension to replace partially or all of the IPA diluents as specified in the Table 13 below. The first sample contained no FS and HCl vapor was used as the fusing agent to serve as a control. As shown by the performance data in Table 13, when concentration of the FS is equivalent to over-coat concentrations, similar resistance, TT, and haze value was achieved in sample 5 as compared to the control sample 1. Adding small amounts of fusing agents contained in CT3 therefore does appear to fuse the AgNWs to form the nanostructured network, as evidenced by the improvement in the resistance of the AgNW films. At lower CT3 ratios however, the fusing did not occur after one hour of coating. The low resistance observed in sample 5 was after coating the substrate with the mixed solution after 1 hour. It should be noted that without additional acid in the system, AgF plated out 30 mins after coating.

TABLE 13

| | AgNW/IPA/FS (ml) | Ink Composition | Ohm/sq | % TT/Haze |
|---|---|---|---|---|
| 1 | 0.2/0.9/0 | Dilution Control and HCl Vapor | 109 | 91.2/1.16 |
| 2 | 0.2/0.81/0.09 | Reduce IPA 10% and add 10% CT3 | — | 91.1/1.42 |
| 3 | 0.2/0.675/0.225 | Reduce IPA 25% and acid 20% CT3 | — | 91.4/1.34 |
| 4 | 0.2/0.450/0.450 | Reduce IPA 50% and add 50% CT3 | — | 92.1/1.03 |
| 5 | 0.2/0/0.9 | Reduce IPA 100% and use AgNW in CT3 | 69 | 91.6/1.16 |

Example 11 Two Ink Solution Fusing

A two ink solution sintering system has been developed and shown in this example. A two ink solution sintering system is one in which an AgNW ink is used to form a first coating and a distinct FS ink is used to form a second coating on top of the AgNW ink coating. Specifically, propylene glycol (PG) has been added to isobutanol (IBA) with PG serving as the reducing agent. Compared to the EtOH or IPA systems, IBA in the two ink system has a higher boiling point and higher viscosity, which is believed to lead to more uniform coating. However, unlike EtOH, IBA does not reduce the Ag$^+$ as readily so PG is added to augment the reducing capability of this system. The ink had a AgNW concentration of 0.01-0.5 weight percent. All films were made on a PET sheet, which had a haze of ~0.3-0.4, and a % TT of ~93.0-93.3 including the PET substrate.

Solutions 1-4 listed in the Table 14 below were made with the mixture solvents of IBA and PG in a 90:10 ratio. On average 9 resistance data points were collected and the resistance data shown in Table 14 is an average of these 9 data points. The films without the fusing treatment had resistance >20,000 ohm/sq. As shown in Table 14 below, upon fusing treatment, significant reduction in resistance were observed for all samples with high TT and low haze.

TABLE 14

| Solution # | Sintering Solution | Ohm/sq | % TT/Haze |
|---|---|---|---|
| 1 | 1.6 uL/mL $HNO_3$ + 0.1 mg/ml $AgNO_3$ | 110 | 91.1/1.24 |
| 2 | 1.6 uL/mL $HNO_3$ + 0.1 mg/ml AgF | 145 | 91.7/1.07 |
| 3 | 0.16 uL/mL $HNO_3$ + 0.1 mg/ml $AgNO_3$ | 181 | >90.0 |
| 4 | 0.16 uL/mL $HNO_3$ + 0.1 mg/ml AgF | 69 | 90.8/1.46 |

Example 12 IBA Solution Ink with Organic Reducing Agents

One-ink systems were created by adding various reducing agents at small quantities into the IBA ink. Table 15 provides a list of reducing agents that has shown to provide fusing in the one ink system. These reducing agents vary in terms of reduction strength and can also have other interesting properties. For example, during oxidation the reducing agents can change color which may improve the haze of the overall film.

TABLE 15

| Chemical Name | Chemical Formula | Fuse | Chemical Structure |
|---|---|---|---|
| Aminophenol: | $H_2NC_6H_4OH$ Molecular Weight 109.13 | YES | |
| Hydroquinone | $C_6H_4$-1,4-$(OH)_2$ Molecular Weight 110.11 | YES | |
| Benzoin: | $C_6H_5CH(OH)COC_6H_5$ Molecular Weight 212.24 | YES | |
| EBPB: | $CH_3CH\{C_6H_2[C(CH_3)_3]_2OH\}_2$ Molecular Weight 438.69 | YES | |
| 4-Amino-3-hydroxy-1-naphthalenesulphonic acid | $H_2NC_{10}H_5(OH)SO_3H$ Molecular Weight 239.25 | YES | |

Sample solutions 1-6 listed in the table 16 below were made with IBA and various reducing agents. On average 6 to 9 resistance data points were collected and the resistance data shown in Table 16 is an average of these 6 to 9 data points. The films without the sintering treatment were formed from AgNW inks comprises 0.01-0.5 weight percent AgNW in IBA and the films had resistance >20,000 ohm/sq. Fused films were formed by coating a thin layer (about 50 μm wet thickness) of the FS over a deposited AgNW film using blade coating and then dried. As shown in Table 15 below, upon fusing treatment, significant reduction in resistance were observed for samples contained benzoin and aminophenol. With added reducing agent, other higher boiling point solvents may also be used.

In general, the films after fusing treatment showed high TT and low haze. During drying the $Ag^+$ and reducing agent were concentrated and the $Ag^+$ was reduced to metallic $Ag^0$. Based on the results with the CT3 reducing agent in Example 10, the AgF nitric acid solutions would not be expected to be effective alone to significantly fuse the nanowires without the reducing agent even though the fluoride ion can induce sintering of the nanowires.

TABLE 16

| Sample | Solutions in Isobutanol | Ohm/sq | % TT |
|---|---|---|---|
| 1 | 0.1 mg/ml AgF, 1.6 uL/mL $HNO_3$, 0.17 mg/ml Benzoin | 62 | 90.7 |
| 2 | 0.5 mg/ml AgF, 8 uL/mL $HNO_3$, 0.85 mg/ml Benzoin | 288 | >90.0 |
| 3 | 0.5 mg/ml AgF, 8 uL/mL $HNO_3$, 0.17 mg/ml Benzoin | 144 | >90.0 |
| 4 | 0.5 mg/ml AgF, 8 uL/mL $HNO_3$, 0.35 mg/ml EPBP | 179 | >90.0 |
| 5 | 0.5 mg/ml AgF, 8 uL/mL $HNO_3$, 0.20 mg/ml AHNS | 457 | >90.0 |
| 6 | 0.5 mg/ml AgF, 8 uL/mL $HNO_3$, 0.1 mg/ml Aminophenol | 138 | 92.3 |

Figure 6:
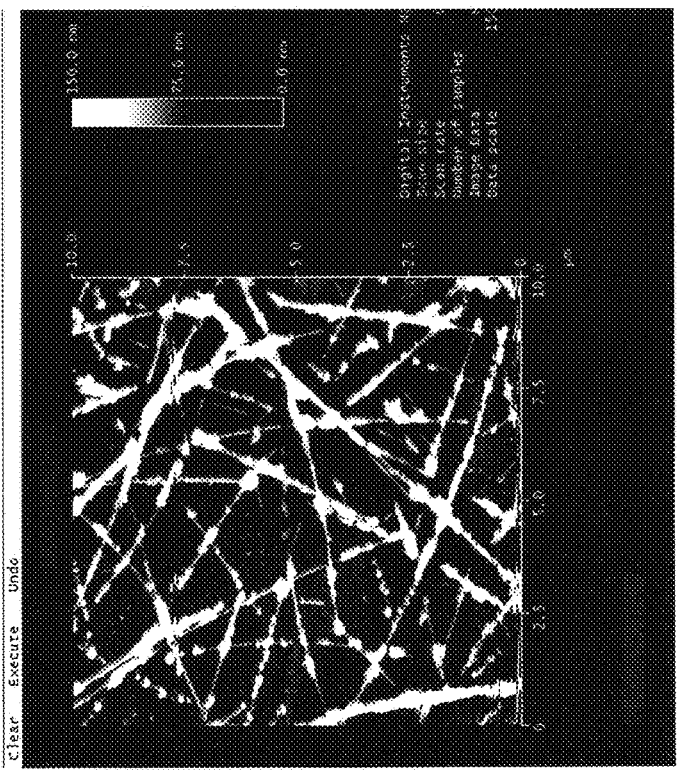
FIG. 6 is an atomic force microscopy image of AgNW network formed with diluted copper solution of Example 8.
Figure 6A:
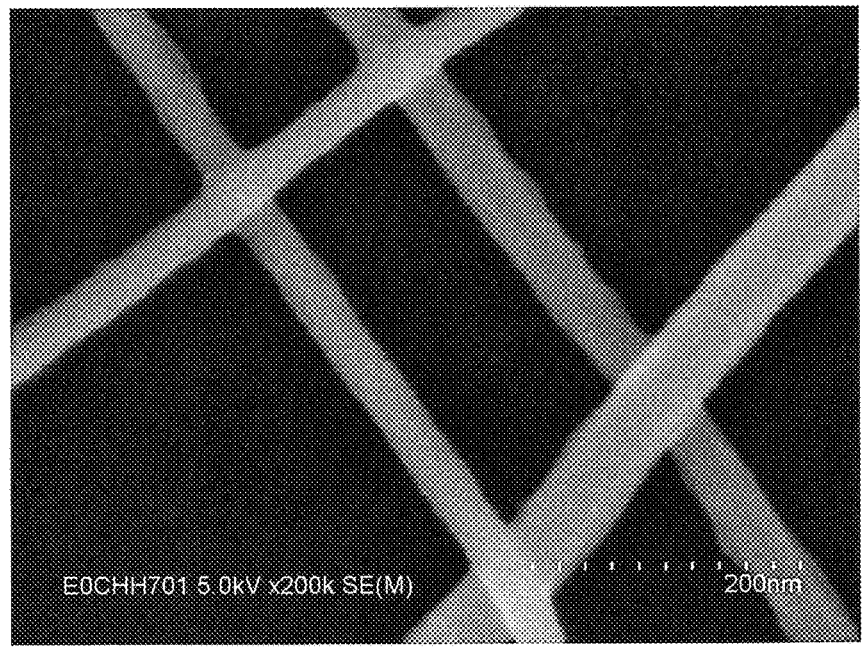
FIG. 6a is a composite of SEM images, taken at different magnifications, of the surface of an AgNW film representative of sample 1 in Table 11.
Figure 6A:
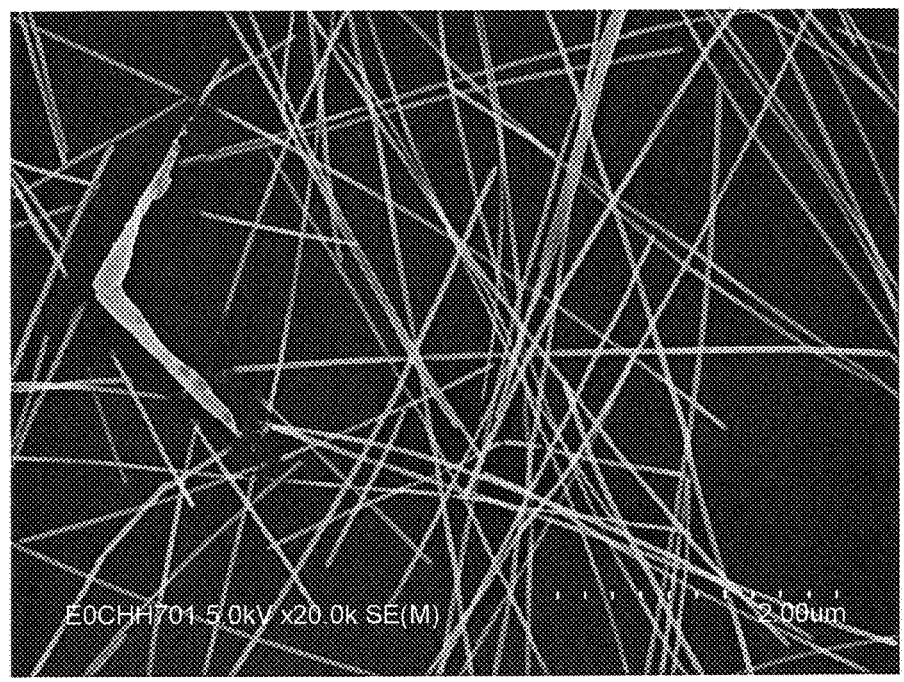
Figure 6B:
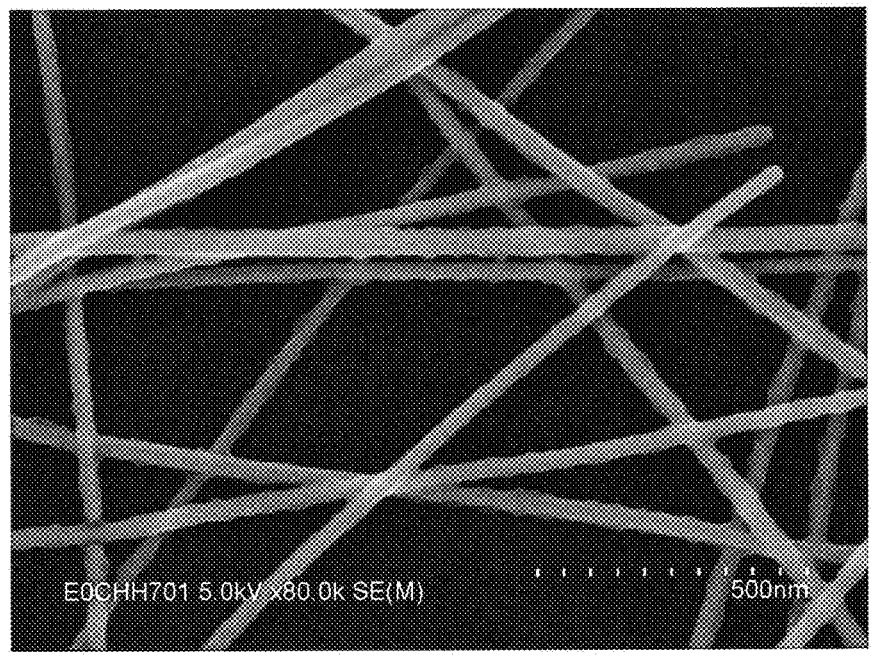
FIG. 6b is a composite of SEM images, taken at different magnifications, of the surface of an AgNW film representative of the films formed with CT2 in Table 12, however, having a sheet resistance of about 200 Ohm/sq.
Figure 6B:
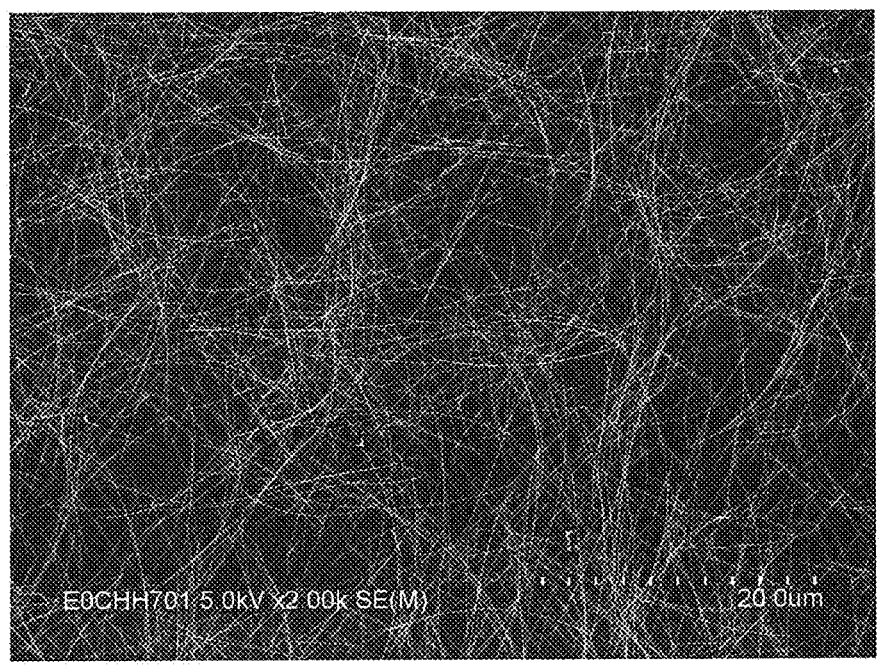
Figure 7:
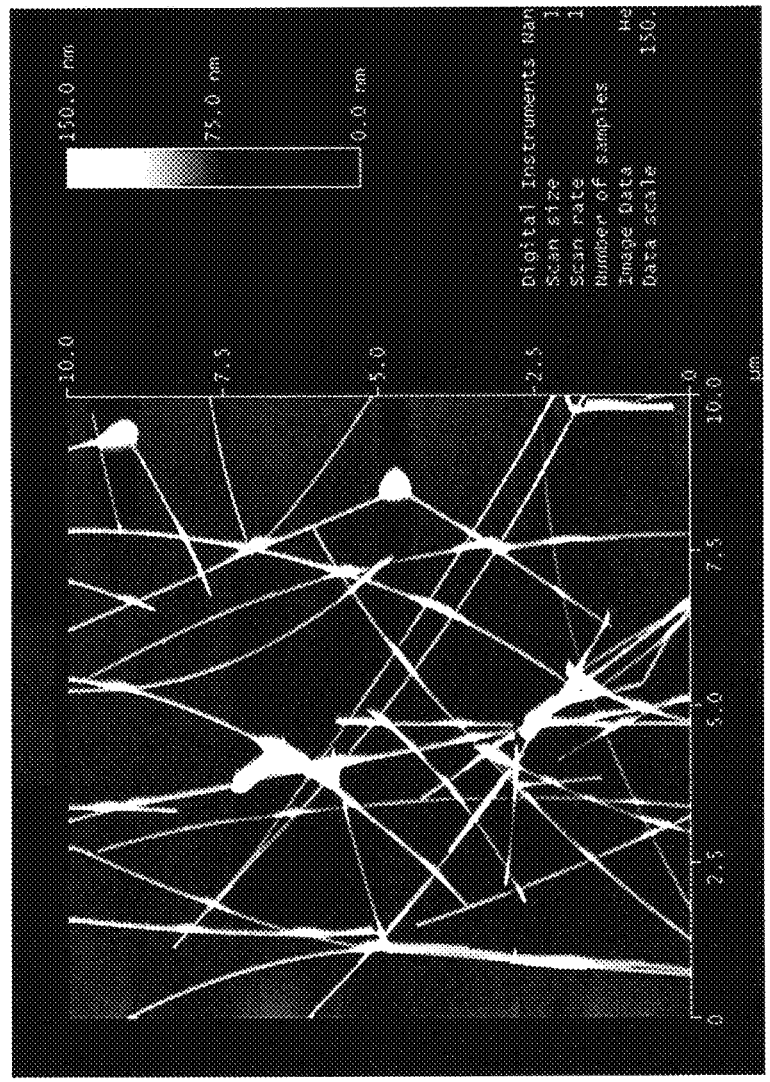
FIG. 7 is an atomic force microscopy image of AgNW network formed with benzoin based solution sintering of Example 12.

The AFM of the film with benzoin based solution sintering (sample 1) was plotted in FIG. 6. As show in FIG. 7, growth is preferential at rough areas with areas where interaction with seeding nucleus is strongest and barrier to formation is least. Growth appears suppressed on PET which makes sense since the surface energy of the AgNWs is much higher than PET.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A set of solutions for sequential application comprising:
a first container with a nanowire ink comprising a dispersion of metal nanowires; and
a second container with a distinct fusing solution comprising a metal ion source and a reducing agent, wherein the fusing solution is effective to fuse a film of the metal nanowires upon drying wherein the metal ion source comprises metal ions at a concentration from about 0.0005M to about 0.05M or an oxidizing agent.

2. The set of solutions of claim 1 wherein the oxidizing agent comprises a strong acid at a concentration of at least about 0.000001M.

3. The set of solutions of claim 1 wherein the oxidizing agent comprises nitric acid.

4. The set of solutions of claim 1 wherein the fusing solution is substantially free of halide anions.

5. The set of solutions of claim 1 wherein the reducing agent comprises methanol, isopropyl alcohol, 1-butanol, 2-butanol, isobutanol, 2,3-butanediol, hydroxyacetone, propylene glycol, or a combination thereof and wherein the solvent is a reducing agent.

6. The set of solutions of claim 1 wherein the reducing agent comprise ethanol.

7. The set of solutions of claim 1 wherein the reducing agent can reduce the metal ions to its corresponding metal element.

8. The set of solutions of claim 1 wherein the reducing agent comprises hydroxyacetone, a-hydroxyacetophenone, phenol, aminophenol, hydroquinone pyrogallol, 4-amino-3-hydroxy-1-naphthalenesulfonic acid, catechol, phenidone, hydroxylamine, a sugar alcohol, a monosaccharide, a disaccharide, benzoin, furoin, phthalhydrazide, adipic acid dihydrazide, phenidone, 1-methyl-1,4-cyclohexadiene, dihydrodiazine, a sulfite, a hydrogen sulfite, a thiosulfate, a phosphite, a hydrogenphosphite, oxalate, or a combination thereof.

9. The set of solutions of claim 1 wherein the metal ion source comprises metal ions and wherein the metal ions comprises silver ions.

10. The set of solutions of claim 1 wherein the metal ions source comprises a metal salt comprising metal elements that are distinct from metal element of the metal nanowires.

11. The set of solutions of claim 1 wherein the nanowire ink comprises at least about 0.01 weight percent metal nanowires.

12. The set of solutions of claim 1 wherein the metal nanowires comprise copper, gold, indium, tin, iron, titanium, platinum, palladium, nickel, cobalt, or an alloy combination thereof.

13. The set of solutions of claim 1 wherein the metal nanowires comprise silver.

14. The set of solutions of claim 1 wherein the nanowires have an average diameter of no more than about 75 nm and a length of at least about 5 microns.

15. The set of solutions of claim 1 wherein the metal ion source comprises an acid that can dissolve metal ions from the metal nanowires.

16. The set of solutions of claim 1 wherein the nanowire ink comprises metal nanowires at a concentration from 0.01 wt % to about 5 wt % and wherein the metal nanowires comprise silver.

17. The set of solutions of claim 1 wherein the reducing agent comprises a sugar.

18. The set of solutions of claim 1 wherein the fusing solution has a pH from about 2 to about 6 pH units.

19. A solution for forming an electrically conductive fused metal nanostructured network, the solution being stable without particle nucleation and comprising solvent, metal nanowires, a metal ion source, a surfactant, and a reducing agent, wherein the metal ion source comprises metal ions at a concentration from about 0.0005M to about 0.05M or an oxidizing agent, wherein the solvent comprises water, methanol, ethanol, isopropyl alcohol, isobutyl alcohol, 2-butanol or mixtures thereof.

20. The solution of claim 19 wherein the metal ion source is an oxidizing agent, and the oxidizing agent comprises a strong acid at a concentration of at least about 0.000001M.

21. The solution of claim 19 wherein the metal nanowires comprise silver nanowires and the metal ion source comprises a dissolved salt comprising a metal ion of an element different from silver.

22. The solution of claim 19 wherein the metal nanowires comprise silver nanowires, the metal ion source comprises a dissolved metal salt, and the solution comprises a reducing agent and an oxidizing agent, wherein the reducing agent comprises an alcohol and the oxidizing agent comprises an acid.

23. The solution of claim 19 comprising metal nanowires at a concentration from 0.01 wt % to about 5 wt % and wherein the metal nanowires comprise silver.

24. The solution of claim 19 wherein the reducing agent comprises sugar.

25. The solution of claim 19 having a pH from about 2 to about 6 pH units.

26. The solution of claim 19 wherein the reducing agent comprises hydroxyacetone, a-hydroxyacetophenone, phenol, aminophenol, hydroquinone pyrogallol, 4-amino-3-hydroxy-1-naphthalenesulfonic acid, catechol, phenidone, hydroxylamine, a sugar alcohol, a monosaccharide, a disaccharide, benzoin, furoin, phthalhydrazide, adipic acid dihydrazide, phenidone, 1-methyl-1,4-cyclohexadiene, dihydrodiazine, a sulfite, a hydrogen sulfite, a thiosulfate, a phosphite, a hydrogenphosphite, oxalate, or a combination thereof.

27. The solution of claim 19 wherein the metal ion source comprises metal ions and wherein the metal ions comprises silver ions.

28. The solution of claim 19 wherein the metal ions source comprises a metal salt comprising metal elements that are distinct from metal element of the metal nanowires.

29. The solution of claim 19 wherein the nanowire ink comprises at least about 0.01 weight percent metal nanowires.

30. The solution of claim 19 wherein the metal nanowires comprise copper, gold, indium, tin, iron, titanium, platinum, palladium, nickel, cobalt, or an alloy combination thereof.

31. The solution of claim 19 wherein the metal nanowires comprise silver.

32. The solution of claim 19 wherein the nanowires have an average diameter of no more than about 75 nm and a length of at least about 5 microns.

* * * * *